(12) United States Patent
Mueller

(10) Patent No.: US 11,521,080 B2
(45) Date of Patent: Dec. 6, 2022

(54) DECLARATIVE RULE-BASED DECISION SUPPORT SYSTEM

(71) Applicant: SAP SE, Walldorf (DE)

(72) Inventor: Michael Mueller, Heidelberg (DE)

(73) Assignee: SAP SE, Walldorf (DE)

( * ) Notice: Subject to any disclaimer, the term of this patent is extended or adjusted under 35 U.S.C. 154(b) by 516 days.

(21) Appl. No.: 16/405,632

(22) Filed: May 7, 2019

(65) Prior Publication Data

US 2020/0356871 A1  Nov. 12, 2020

(51) Int. Cl.
| | |
|---|---|
| G06N 5/02 | (2006.01) |
| G06F 16/2457 | (2019.01) |
| G06F 30/20 | (2020.01) |
| G06Q 10/08 | (2012.01) |
| G06Q 10/06 | (2012.01) |
| G06Q 10/04 | (2012.01) |

(52) U.S. Cl.
CPC ....... *G06N 5/025* (2013.01); *G06F 16/24578* (2019.01); *G06F 30/20* (2020.01); *G06Q 10/04* (2013.01); *G06Q 10/0631* (2013.01); *G06Q 10/0639* (2013.01); *G06Q 10/06312* (2013.01); *G06Q 10/06316* (2013.01); *G06Q 10/087* (2013.01)

(58) Field of Classification Search
None
See application file for complete search history.

(56) References Cited

U.S. PATENT DOCUMENTS

| | | | |
|---|---|---|---|
| 8,700,443 B1* | 4/2014 | Murray | G06Q 10/06315 705/7.31 |
| 2008/0306798 A1* | 12/2008 | Anke | G06Q 10/06316 705/7.26 |
| 2009/0216343 A1* | 8/2009 | Drebinger | G05B 19/054 700/19 |
| 2012/0066547 A1* | 3/2012 | Gilbert | H04L 41/5074 714/26 |

(Continued)

OTHER PUBLICATIONS

Risk Management Decision; Gantz et al.; 2013 (Year: 2013).*

(Continued)

*Primary Examiner* — Deirdre D Hatcher
(74) *Attorney, Agent, or Firm* — Klarquist Sparkman, LLP

(57) ABSTRACT

A computer-implemented method can receive a new plan deviation alert having a deviation level that quantifies a mismatch between expected supply chain parameters specified by a supply chain plan and observed supply chain parameters. Responsive to the new plan deviation alert, the method can perform a rule-based search to find a plurality of potential remediation solutions to correct the mismatch. The method can simulate implementation of the potential remediation solutions and evaluate expended resources associated with them. Based on the evaluated expended resources, the method can generate a ranked list of candidate remediation solutions and display the ranked list of candidate remediation solutions in a user interface. The method can receive a selected remediation solution from the ranked list of candidate remediation solutions for initiation. Machine learning can be used on an expert user's selection to adapt to the expert's preferences and provide more relevant remediation solutions.

19 Claims, 25 Drawing Sheets

(56) References Cited

U.S. PATENT DOCUMENTS

2013/0117267 A1* 5/2013 Buryak ................ G06F 16/435
707/737
2015/0073929 A1* 3/2015 Psota ................ G06Q 30/0605
705/26.2

OTHER PUBLICATIONS

"Cluster Analysis," Wikipedia, en.wikipedia.org, visited May 3, 2019, 18 pages.
"Collaborative Enterprise Planning," SAP, https://www.sap.com/sea/products/digital-supply-chain, Oct. 2018, 11 pages.
"Prolog," Wikipedia, en.wikipedia.org, visited Apr. 6, 2019, 11 pages.
"Recursion," Wikipedia, en.wikipedia.org, visited May 3, 2019, 25 pages.
"Supply Chain Management," Wikipedia, en.wikipedia.org, visited May 3, 2019, 11 pages.
Hastie, et al.,"The Elements of Statistical Learning—Data Mining, Inference, and Prediction," Springer Series in Statistics, Second Edition, Corrected 12$^{th}$ printing—Jan. 13, 2017, pp. 501-507.

* cited by examiner

```
DEMAND(LOCMAT(LOCD, MATD), DATED, QUANTITYD, SOLUTION) :-
    CURRENT_PREDICATE(TRANSPORT/5),
    TRANSPORT(IDSOS, MATD, INPUTLOC, LOCD, DURATION),
    QUANTITYD #> 0,
    DATEDEP #= DATED - DURATION,
    DEMAND(LOCMAT(INPUTLOC, MATD), DATEDEP, QUANTITYD, SOLUTIONDEP),
    APPEND([TRANSPORT_ACTIVITY(TRANSPORT(IDSOS, MATD, INPUTLOC, LOCD, DURATION), DATEDEP, QUANTITYD)], SOLUTIONDEP, SOLUTION).
```

FIG. 15

DECLARATIVE RULE-BASED DECISION SUPPORT SYSTEM

BACKGROUND

Planners and decision makers face the challenge that they must combine and analyze data from various sources to resolve unexpected problems when the actual observations deviate from some planned parameters. The challenge can be aggregated when such discrepancy must be resolved within a short time frame while there are potentially numerous options to address the problem but the feasibility and/or cost of those options are unknown to the planners and decision makers.

The problem is particularly of concern for supply chain planning scenarios, where numerous decisions must be made every day. Although a supply chain management system (SCMS) typically includes planning software that can forecast demands and plan the supply to optimally match the forecasted demands, in reality, it is not uncommon for the actual demand to deviate from the forecast. The actual supply can also deviate from the plan. As such, supply chain planners and decision makers must constantly monitor supply chain deviations and seek solutions to mitigate such deviations. Due to the high volume of the tasks and intense time pressure, the planners and decisions makers are often overwhelmed. Moreover, the solutions they find may be suboptimal in terms of efficiency and cost.

There thus remains a need for an intelligent decision support system and related method to improve the supply chain management.

SUMMARY

This Summary is provided to introduce a selection of concepts in a simplified form that are further described below in the Detailed Description. This Summary is not intended to identify key features or essential features of the claimed subject matter, nor is it intended to be used to limit the scope of the claimed subject matter.

In one embodiment, a computer-implemented method is disclosed herein. The method can include receiving a new plan deviation alert comprising a deviation level which quantifies a mismatch between expected supply chain parameters specified by a SCMS plan and observed SCMS parameters. The method can also include testing a plurality of remediation solutions for correcting the mismatch. The testing can include navigating successful paths within SCMS declarative rules from general solutions to specific predicates that are tested against stored SCMS resources and constraints. The testing can perform a rule-based search for which of the plurality of remediation solutions are possible and enumerates the plurality of remediation solutions that are possible, given the SCMS resources and constraints, and the testing can transform the successful paths within the SCMS declarative rules into activity-based views. The method additionally can include evaluating expended resource simulations associated with the plurality of possible remediation solutions. Evaluating expended resources can include simulating implementation of activities within the activity-based views of the plurality of possible remediation solutions. Based on the evaluated expended resource simulations, the method can further include generating, out of the possible remediation solutions, a ranked list of candidate remediation solutions, and displaying, in a user interface, the ranked list of candidate remediation solutions.

In some embodiments, a rule-based decision support system is disclosed herein. The system can include one or more processors, a plan deviation alert manager, a rule-based search engine, a remediation simulator, a remediation advisor, and a user interface. The plan deviation alert manager can be adapted to receive a new plan deviation alert comprising a deviation level, which quantifies a mismatch between expected supply chain parameters specified by a supply chain plan and observed supply chain parameters. The rule-based search engine can be adapted to perform a rule-based search of data defining supply chain resources and constraints, and the rule-based search can find a plurality of potential remediation solutions to correct the mismatch. The remediation simulator can be adapted to simulate implementation of the plurality of potential remediation solutions, and based on results of simulation, evaluate expended resources associated with the plurality of potential remediation solutions. The remediation advisor can be adapted to generate a ranked list of candidate remediation solutions out of the potential remediation solutions based on the evaluated expended resources. The user interface can be adapted to display the ranked list of candidate remediation solutions and receive a selected remediation solution from the ranked list of candidate remediation solutions.

In some embodiments, the disclosure also concerns one or more computer-readable media comprising computer-executable instructions that, when executed, cause a computing system to perform a method. The method can include receiving a new plan deviation alert comprising a deviation level, which quantifies a mismatch between expected supply chain parameters specified by a supply chain plan and observed supply chain parameters. Responsive to the new plan deviation alert, the method can perform a rule-based search of data defining supply chain resources and constraints to find a plurality of potential remediation solutions to correct the mismatch. Performing the rule-based search can include determining a deviation remediation goal based on the deviation level, automatically instantiating a set of rules based on the deviation remediation goal and the supply chain resources and constraints, and constructing a recursive backward chain based on the deviation remediation goal, the set of rules, and the supply chain resources and constraints. The method can also include evaluating expended resources associated with the plurality of potential remediation solutions. Evaluating expended resources can include simulating implementation of the plurality of potential remediation solutions. Out of the potential remediation solutions, the method can generate a ranked list of candidate remediation solutions based on the evaluated expended resources, and display, in a user interface, the ranked list of candidate remediation solutions. The method can also include receiving, via the user interface, a selected remediation solution from the ranked list of candidate remediation solutions, adding the new plan deviation alert and the selected remediation solution corresponding to the new plan deviation alert to an experience repository, and adding an outcome of the selected remediation solution to the experience repository, the outcome indicating whether the selected remediation solution actually corrects the mismatch. The method can further include identifying precedents of the new plan deviation alert in the experience repository. A precedent can represent a previous plan deviation alert for the product stored in the experience repository that is determined to be similar to the new plan deviation alert, based on a measurement of distance between the previous plan deviation alert and the new plan deviation alert on a plan deviation map having a first dimension representing a normalized due period and a second dimension representing a normalized quantity of a product. In addition, the method can include evaluating a degree of uniformity of the selected remediation solutions corresponding to the precedents and the outcome of the selected remediation solutions corresponding to the precedents. Further, the method can include recommending a uniform remediation solution when the degree of uniformity of the selected remediation solutions corresponding to the precedents exceeds a predefined threshold and the outcome of the selected remediation solutions corresponding to the precedents indicates the selected remediation solutions actually correct the mismatch.

The foregoing and other objects, features, and advantages will become more apparent from the following detailed description, which proceeds with reference to the accompanying figures.

BRIEF DESCRIPTION OF THE DRAWINGS

FIG. 15 is a code listing depicting an example actual rule.

DETAILED DESCRIPTION

Example 1—Overview

Typically, a supply chain has a certain lead time for sourcing raw materials and providing resources. Thus, it is necessary to plan early on to determine at what time and what activities need to be carried out to ensure smooth operation. Such planning can be carried out in certain degrees of detail and with different focus to align processes in the supply chain with limited resources.

However, even with meticulous planning, the underlying assumptions of the plan may not match the eventual reality. For example, assumptions about production time and quality can turn out to be false due to unexpected intrinsic or extrinsic factors (e.g., machine malfunction, labor shortage, etc.). In another example, uncontrollable events such as severe weather and accidents can invalidate assumptions about transport durations.

Without advanced warnings, such a deviation can cause a domino effect on other parts of the supply chain and lead to further supply chain planning failures. Although different methods have been proposed to reduce the impact of planning errors (e.g., improving the accuracy of modeling demand and supply, etc.), such methods are inherently vulnerable to plan deviations, especially for products with short production life cycles and high demand forecasting errors.

Meanwhile, when facing plan deviations, planners and decision makers are under time pressure to mitigate the problem, either because of the time critical nature of the decision to be made, or because their time is limited. Especially in large supply chain planning scenarios, where numerous decisions must be made daily, planners may not be able to spend sufficient time to learn about the underlying issues so as to make informed decisions. As a result, their decisions may be sub-optimal or even detrimental for the business.

In view of the above shortcomings, by providing an intelligent declarative rule-based decision support system and related method, the technologies described herein thus offer considerable improvements over existing supply chain management systems.

Example 2—Example Overall System Implementing

A Declarative Rule-based Decision Support System

Figure 1:
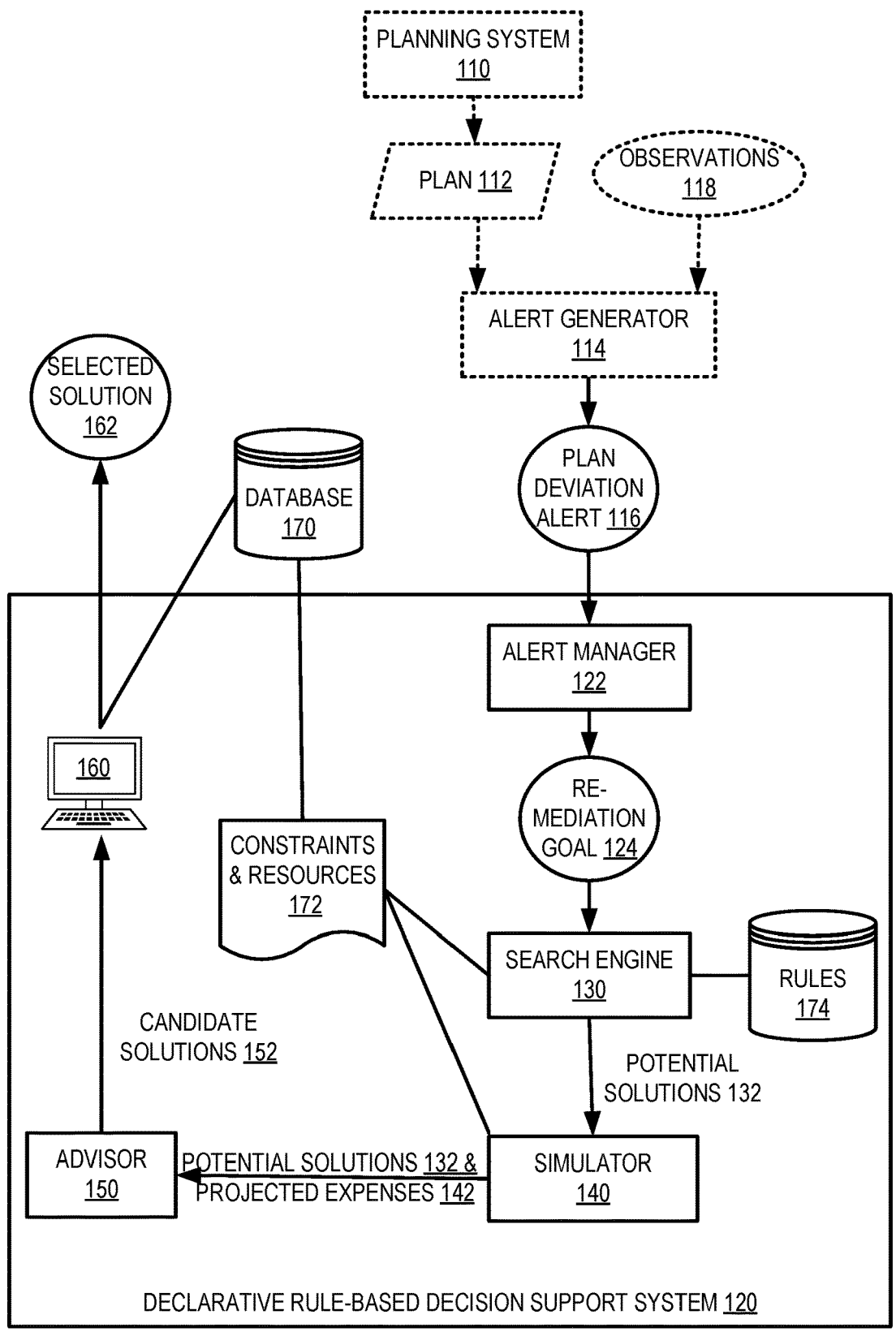
FIG. 1 is a block diagram of an example system implementing a declarative rule-based decision support system.

FIG. 1 is a block diagram of an example overall supply chain management system (SCMS) 100 including a declarative rule-based decision support system 120. The decision support system 120 can be integrated with, or separate from the supply chain planning system 110.

The overall system 100 can include a supply chain planning system 110 that stores and manages a supply chain plan 112 containing a plurality of expected supply chain parameters for a plurality of products. For example, the supply chain plan 112 can contain an expected demand for a specific product including an expected amount and an expected delivery time for the product. In another example, the supply chain plan 112 can contain an expected supply for a product including an expected amount and an expected availability of such supply.

The system 100 can include an alert generator 114, which can generate a new plan deviation alert 116 responsive to detecting a mismatch between the expected supply chain parameters of a product specified by the supply chain plan 112 and the observed supply chain parameters ("observations") 118 of the product.

The rule-based decision support system 120 can include a plan deviation alert manager 122 configured to receive the new plan deviation alert 116, and in response, determine a deviation remediation goal 124 (e.g., based on the alert 116).

Responsive to the new plan deviation alert 116, a rule-based search engine 130 can perform a rule-based search using rules 174 to find a plurality of potential remediation solutions 132 to correct the mismatch. In an example embodiment, supply chain resources and constraints 172 can be derived from the database 170. As described more fully below, the rule-based search engine 130 can query a set of rules 174 based on the supply chain resources and constraints 172 and the deviation remediation goal 124. The database 170 can be a part of the overall system 100 that is either integrated with or separate from the declarative rule-based decision support system 120.

The declarative rule-based decision support system 120 can include a remediation simulator 140 configured to simulate implementation of the plurality of potential remediation solutions 132, and based on the simulation, the remediation simulator 140 can evaluate projected, expended resources 142 (e.g., costs) associated with the plurality of potential remediation solutions 132. Different solutions 132 can have different projected, expended resources 142 (e.g., the resources expended for one solution may be greater or less than those expended for another solution).

The plurality of potential remediation solutions 132 together with the evaluated expended resources 142 can then be fed into a remediation advisor 150, which can be configured to generate a ranked list of candidate remediation solutions 152 out of the plurality of potential remediation solutions 132 based on the evaluated expended resources 142.

The rule-based decision support system 120 can also include a user interface 160 which is configured to display the ranked list of candidate solutions 142. The user interface 160 can be further configured to receive a selected remediation solution 162, for example, from a supply chain planner or decision maker, and the selected remediation solution 162 can be initiated by the system 100 for implementation.

In practice, the systems shown herein, such as system 100, can vary in complexity, with additional functionality, more complex components, and the like. For example, there can be additional functionality within the rule-based search engine 130. Additional components can be included to implement security, redundancy, load balancing, report design, and the like.

The described computing systems can be networked via wired or wireless network connections, including the Internet. Alternatively, systems can be connected through an intranet connection (e.g., in a corporate environment, government environment, or the like).

The system 100 and any of the other systems described herein can be implemented in conjunction with any of the hardware components described herein, such as the computing systems described below (e.g., processing units, memory, and the like). In any of the examples herein, the plan deviation alert 116, deviation remediation goal 124, potential remediation solutions 132, projected expended resources 142, candidate remediation solutions 152, selected remediation solution 162, supply chain resources and constraints 172, the rules 174, and the like can be stored in one or more computer-readable storage media or computer-readable storage devices. The technologies described herein can be generic to the specifics of operating systems or hardware and can be applied in any variety of environments to take advantage of the described features.

Example 3—Example Overall System Implementing

A Rule-Based Decision Support System with Adaptive Learning

Figure 2:
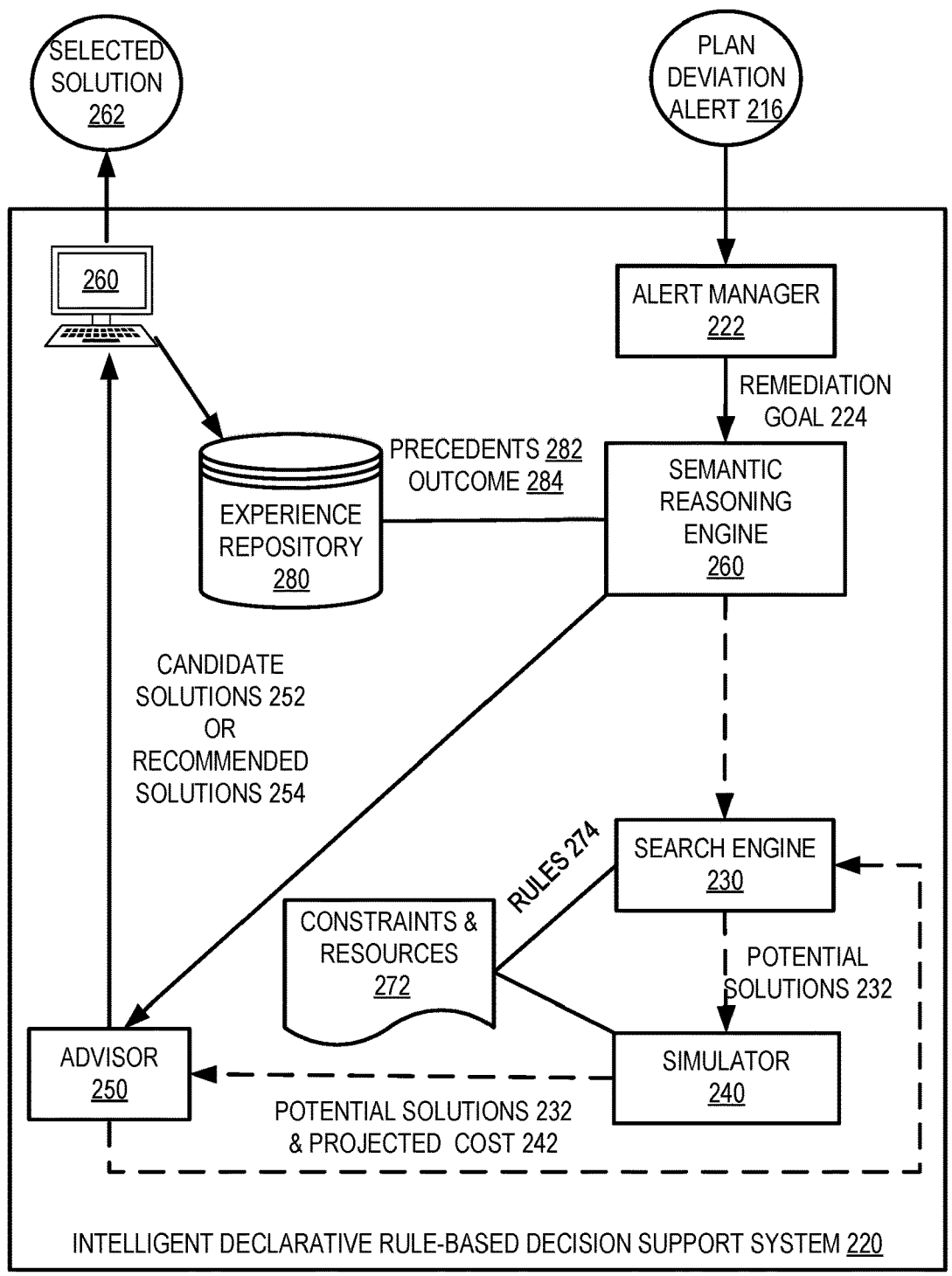
FIG. 2 is a block diagram of an example system implementing an intelligent declarative rule-based decision support system.

FIG. 2 is a block diagram of another example overall supply chain management system 200 including an intelligent declarative rule-based decision support system 220 similar to that of FIG. 1, but with adaptive learning capability. For simplicity, other components of the overall system 200, such as the supply chain planning system, the alert generator, the database, etc., are omitted from FIG. 2.

Like the decision support system 120, the rule-based decision support system 220 can include a plan deviation alert manager 222 configured to determine a deviation remediation goal 224 in response to receiving a new plan deviation alert 216. A rule-based search engine 230 can be configured to query a set of rules 274 and perform a rule-based search of supply chain resources and constraints 272 to find a plurality of potential remediation solutions 232.

The rule-based decision support system 220 can also include a remediation simulator 240 configured to simulate implementation of the plurality of potential remediation solutions 232 and evaluate expended resources 242 associated thereof. Likewise, a remediation advisor 250 can be configured to generate a ranked list of candidate remediation solutions 252 out of the plurality of potential remediation solutions 232 based on the evaluated expended resources 242. A user interface 260 can be configured to display the ranked list of candidate remediation solutions 252 and receive a selected remediation solution 262, which can be initiated by the system 200.

In addition to the system components described in FIG. 1 above, the rule-based decision support system 220 can further include an experience repository 280 and a semantic reasoning engine 260. As described more fully below, the experience repository 280 can be configured to store any new and previous plan deviation alerts (e.g., 216) and the selected remediation solutions (e.g., 262) corresponding to those plan deviation alerts. Additional information can be stored in the experience repository as well, such as the outcome 284 of the selected or initiated remediation solutions, the ranked list of candidate solutions 252, etc.

The experience repository can be configured to provide feedback to the semantic reasoning engine 260. For example, the semantic reasoning engine 260 can be configured to identify precedents 282 of the new plan deviation alert 216 in the experience repository 280. As described herein, the precedents can represent a previous plan deviation alert for the product stored in the experience repository that is determined to be similar to the new plan deviation alert 216.

As described more fully below, after receiving a new plan deviation alert 216, instead of immediately activating the rule-based search engine 230 to find the potential remediation solutions 232, the rule-based decision support system 220 can first invoke the semantic reasoning engine 260 to find if there are any precedents 282 of the new plan deviation alert 216 in the experience repository 280. If such precedents 282 are found, they can be fed, optionally together with the outcome information 284, directly to the remediation advisor 250, bypassing the rule-based search engine 230 and the remediation simulator 240.

The remediation advisor 250 can be configured to evaluate a degree of uniformity of the selected or initiated remediation solutions corresponding to the precedents 282, and optionally together with the outcome information 284, to provide a recommended remediation solution 254, which can be selected for initiation by the system 200. If the remediation advisor 250 cannot recommend a remediation solution, it can feed back to the rule-based search engine 230 for further processing.

On the other hand, if no precedent 282 is found or the remediation advisor deems the selected or initiated remediation solutions corresponding to the precedents 282 are not appropriate to satisfy the deviation remediation goal 224, then the rule-based search engine 230 and the remediation simulator 240 can be invoked to find potential remediation solutions 232 and evaluate their expended resources 242, which can then be used to determine the candidate remediation solutions 252.

Thus, the semantic reasoning engine together with the experience repository can form an expert system which is configured to adaptively learn from past experience and provide more intelligent decision support.

Over time, a large body of training material can be accumulated for improving intelligent decision making by the system. Such training material can be doubly beneficial because the system can already be customized for the particularities of the scenarios that it encounters.

Figure 3:
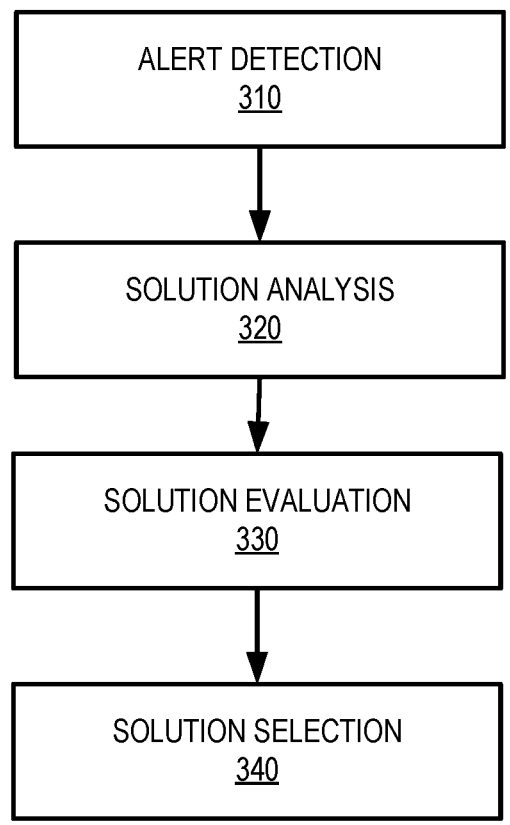
FIG. 3 is a flowchart depicting a plurality of stages of an example overall method of implementing a declarative rule-based decision support system.

Example 4—Example Overall Stages for Implementing a Declarative Rule-Based Decision Support System FIG. 3 is a flowchart of an example overall method 300 of implementing a declarative rule-based decision support system such as the one described in FIG. 1 or FIG. 2.

At the alert detection stage 310, the alert manager 122 in FIG. 1 can receive a new plan deviation alert as described herein. The alert can quantify a mismatch between the expected supply chain parameters of a product specified by the supply chain plan and the observed supply chain parameters of the product.

Responsive to the new plan deviation alert, solution analysis can be performed. The alert manager 122 can generate a deviation remediation goal, which can be used as part of solution analysis.

At the solution analysis stage 320, a plurality of remediation solutions for correcting the mismatch are filtered via the declarative rules to determine which of the plurality of remediation solutions are possible. The testing enumerates the plurality of remediation solutions that are possible, given the SCMS resources and constraints.

At the solution evaluation stage 330, expended resource simulations associated with the plurality of potential remediation solutions can be evaluated. Such evaluation can simulate implementation of the plurality of potential remediation solutions and evaluate expended resources associated with the plurality of potential remediation solutions, based on which the remediation advisor 150 can generate a ranked list of candidate remediation solutions. Such evaluation activity can be performed by the remediation simulator 140 in FIG. 1.

At the solution selection stage 340, the ranked list of candidate solutions can be displayed on a user interface 160, through which a selected remediation solution can be received, which can then be initiated by the system 100.

The method 300 and any of the other methods described herein can be performed by computer-executable instructions (e.g., causing a computing system to perform the method) stored in one or more computer-readable media (e.g., storage or other tangible media) or stored in one or more computer-readable storage devices. Such methods can be performed in software, firmware, hardware, or combinations thereof. Such methods can be performed at least in part by a computing system (e.g., one or more computing devices).

The illustrated actions can be described from alternative perspectives while still implementing the technologies. For example, "receive" can also be described as "send" from a different perspective.

Figure 4:
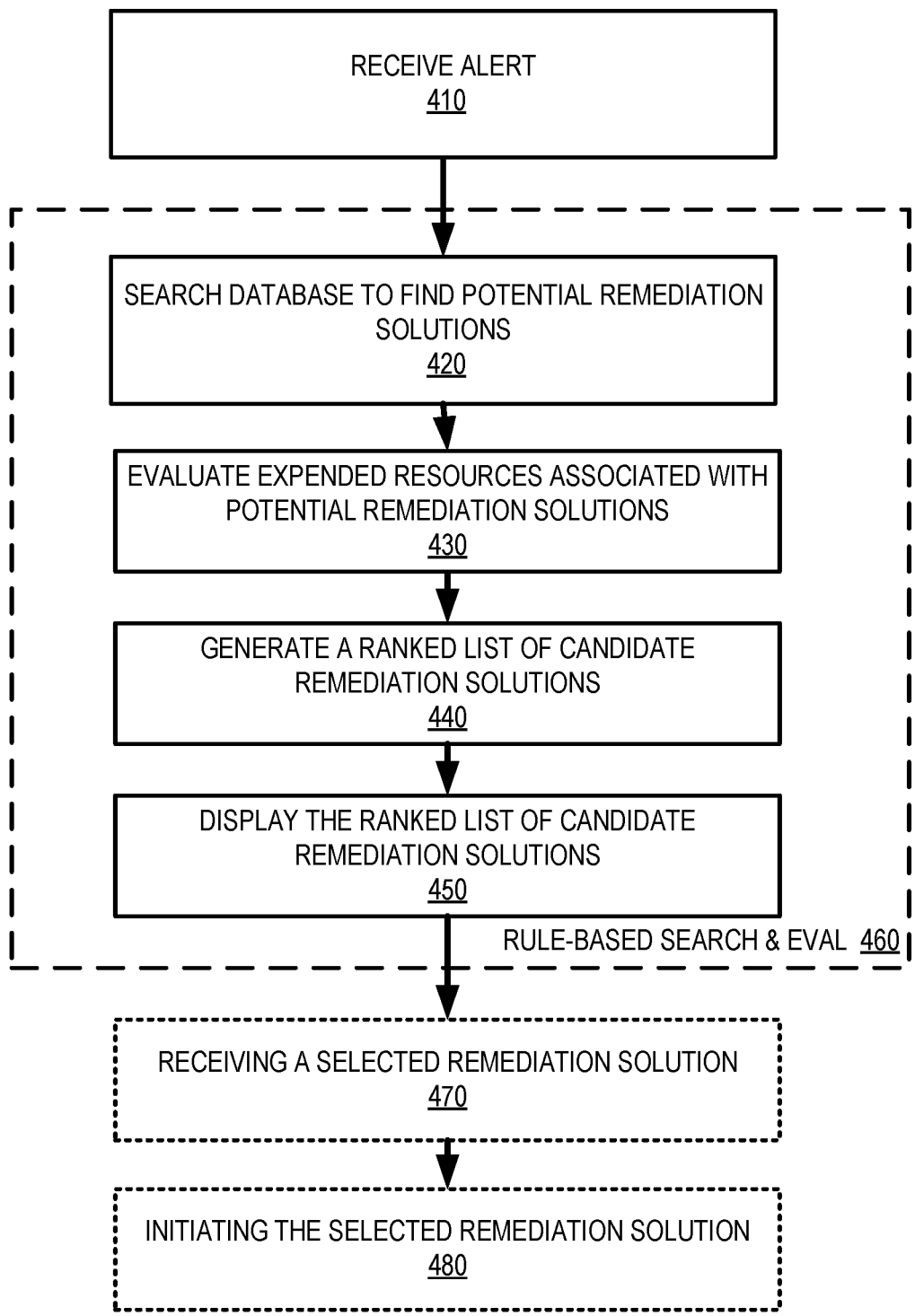
FIG. 4 is a flowchart including example steps for implementing the rule-based decision support system.

Example 5—Example Method of Implementing a Declarative Rule-Based Decision Support System FIG. 4 is a flowchart of a method 400 of implementing the rule-based decision support system depicted in FIG. 1 and the stages depicted in FIG. 3.

In this example, a new plan deviation alert is received at 410. In an example embodiment, the new plan deviation alert can include a deviation level that quantifies a mismatch between expected supply chain parameters of a product specified by a supply chain management system ("SCMS") plan and actual observed SCMS parameters of the product. As described herein, a deviation remediation goal for use in testing can be generated from the alert.

At 420, the method 400 can test a plurality of remediation solutions for correcting the mismatch. Testing can be performed responsive to receiving the new plan deviation alert. Testing can comprise navigating successful paths within SCMS declarative rules from general solutions to specific predicates that are tested against stored SCMS resources and constraints, wherein the testing performs a rule-based search for which of the plurality of remediation solutions are possible. The testing also enumerates the plurality of remediation solutions that are possible, given the SCMS resources and constraints. As described herein, the testing can transform the successful paths within the SCMS rules into activity-based views.

For example, the rule-based search engine 130 in FIG. 1 can perform a rule-based search (e.g., query the rules) to find a plurality of potential remediation solutions that could potentially satisfy the deviation remediation goal.

Specifically, if a deviation remediation goal is determined based on the deviation level, the potential remediation solutions can be filtered to be those that meet the deviation remediation goal.

At 430, the expended resources associated with the plurality of potential remediation solutions can be evaluated. In one example embodiment, the expended resources can be evaluated based on simulating implementation of the plurality of potential remediation solutions. Such evaluation can simulate implementation of the plurality of potential remediation solutions and evaluate expended resources associated with the plurality of potential remediation solutions.

At 440, a ranked list of candidate remediation solutions can be generated out of the potential remediation solutions, based on the evaluated expended resources.

At 450, the ranked list of candidate remediation solutions can be displayed in a user interface.

As describe herein, the combination of steps 420-450 is referred to a rule-based search (e.g., solution analysis) and evaluation 460.

At 470, the method 400 can receive a selected remediation solution, via the user interface, from the ranked list of candidate remediation solutions.

At 480, the method 400 can initiate the selected remediation solution.

Figure 5:
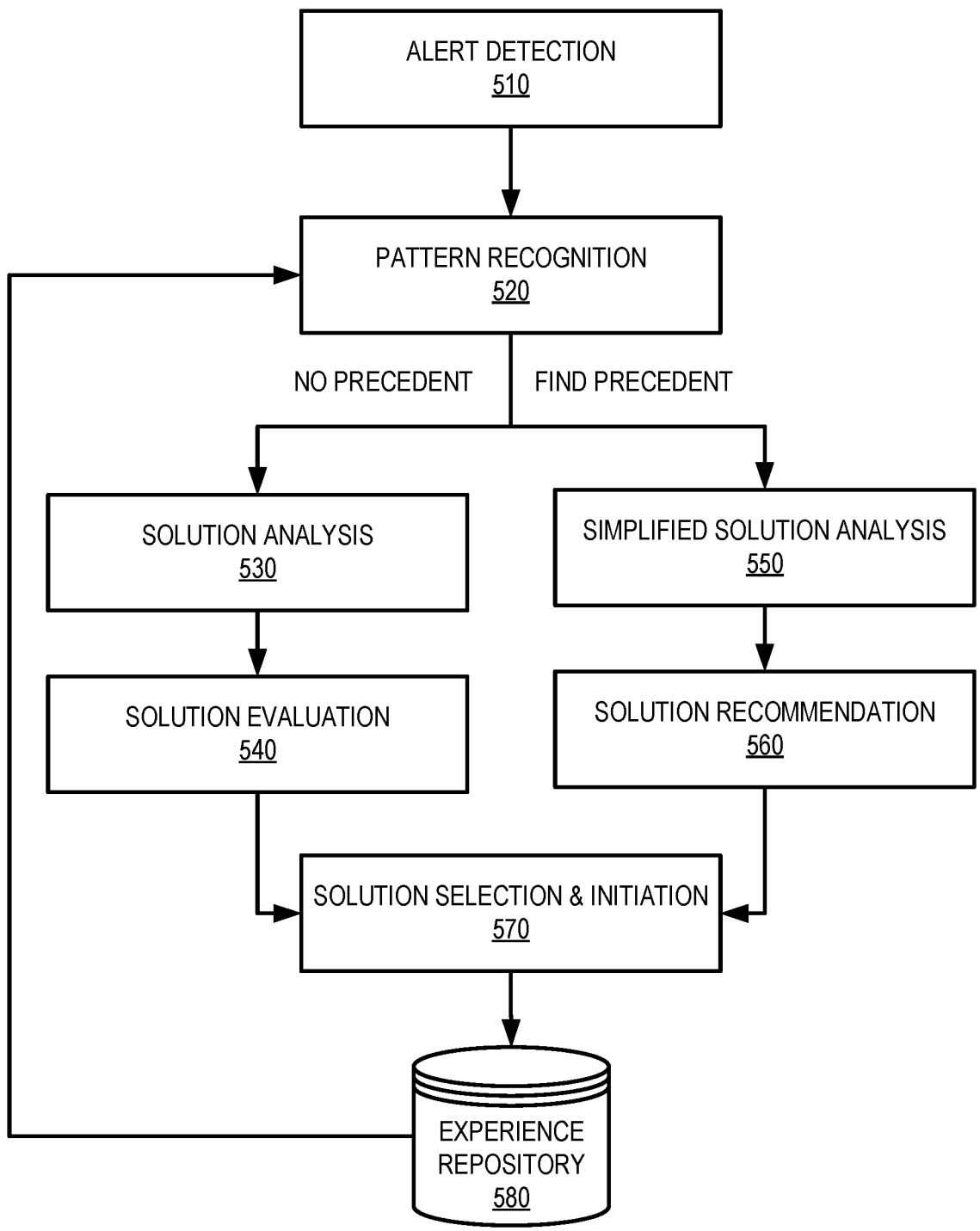
FIG. 5 is a flowchart depicting a plurality of stages of an example method of implementing intelligent declarative rule-based decision support with adaptive learning.

Example 6—Example Overall Stages for Implementing Intelligent Declarative Rule-Based Decision Support with Adaptive Learning FIG. 5 is a flowchart of an example method 500 of implementing an intelligent declarative rule-based decision support and can be implemented, for example, by the system of FIG. 2.

At the alert detection stage 510, the alert manager 222 in FIG. 2 can receive a new plan deviation alert. Responsive to the new plan deviation alert, the alert manager 222 can determine a deviation remediation goal.

At the pattern recognition stage 520, the semantic reasoning engine 260 in FIG. 2 can identify precedents of the new plan deviation alert, if any, in the experience repository 580.

If there is no precedent, then the method 500 can branch to the solution analysis stage 530 to perform a rule-based search to find a plurality of potential remediation solutions that could potentially satisfy the deviation remediation goal. Then at the solution evaluation stage 330, the remediation simulator 240 in FIG. 2 can simulate implementation of the plurality of potential remediation solutions and evaluate the associated expended resources, based on which the remediation advisor 250 in FIG. 2 can generate a ranked list of candidate remediation solutions.

If any precedents are found, then the method 500 can branch to the simplified solution analysis stage 550, where the remediation advisor 250 can evaluate the feasibility of the selected or initiated remediation solutions corresponding to the precedents, to provide a recommended remediation solution based on such evaluation.

At the solution selection and initiation stage 570, the ranked list of candidate remediation solutions or recommended remediation solution can be displayed on a user interface for selection, and the selected remediation solution can be initiated by the system in FIG. 2. The initiated remediation solution, together with other information, such as the new plan deviation alert, the ranked list of candidate remediation solutions, etc., can be stored in the experience repository 580. The actual outcome of the selected or initiated remediation solution, once available, can also be stored in the experience repository 580.

Example 7—Example Supply Chain Resources and Constraints

As noted above, the rule-based decision support system can be configured to access a database that stores data defining supply chain resources and constraints. In any of the examples herein, the supply chain resources and constraints can include any master data characterizing all components of the supply chain, transactional data describing transactions between the components, and constraints defining the limits of the transactions or capacity of the components.

For example, the supply chain resources and constraints can include the number of factories and suppliers for a product, the location ID of a factory or supplier, the material ID of a product, the quantity of a product, data and time information, the lead time of a production line, the transportation time for a delivery route, the capacity of an inventory, the number of work shifts in a production facility, the cost of material or product, the cost of delivery and inventory, the cost of labor, and the like.

In certain embodiments, the resources and constrains of a supply chain can be described in a logic programming language, such as Prolog. For example, the fact that 20 kg cheese dumpling combo are available in location A on 2018 Aug. 1 can be described in the following Prolog statement:

CheeseDumplingCombo(A, 2018 Aug. 21, 20 kg)

In addition, the supply chain resources and constraints can also include additional data deduced from evaluation of rules, for example, by asking a query, as described below.

Example 8—Example SCMS Plan

In any of the examples herein, a supply chain management system ("SCMS") plan can be generated by a SCMS that models the relationship between a forecasted customer demand and the forecasted resources and constraints.

For example, the SCMS plan can include the forecasted quantity and timing of customer demand for a product. The SCMS plan can also include the forecasted product inventories at various distribution centers, the capacity to manufacture the products at various factories, the availability of various product suppliers, etc. The SCMS plan can further include detailed instructions on how to meet the forecasted customer demand based on the forecasted resources and constraints.

For example, the SCMS plan can specify that the forecasted customer demand requires 50 kg cheese at distribution center A by 2018 Apr. 1. It can further forecast that factory B will have an inventory of 100 kg cheese on 2018 Mar. 25. Given that it will take 3 days to make the delivery from factory B to distribution center A, the SCMS can further specify to reserve 50 kg cheese from factory B on 2018 Mar. 25 and ship it to distribution center A on 2018 Mar. 28.

Example 9—Example Plan Deviation Alerts

In any of the examples herein, a plan deviation alert, whether a new one or a previous one, indicates that the actual supply chain resources and constraints cannot meet a specified condition (e.g., the actual customer demand, minimum stock-on-hand, or the like). Specifically, the plan deviation alert can be any alert triggered by the detection of a mismatch between the expected supply chain parameters of a product specified by the supply chain plan and the observed supply chain parameters of the product.

For example, the supply chain plan may forecast a certain amount of customer demand of a product by a certain date. A plan deviation alert can be generated when the actual customer demand of the product exceeds the forecasted amount, or when the time of actual customer demand of the product occurs is earlier than expected.

In another example, the supply chain plan may forecast a certain amount of supply for a product is available by a certain date. A plan deviation alert can be generated when the actual supply for the product is less than the forecasted amount, or the actual supply would not be available by the expected date.

In any of the examples herein, the plan deviation alert can include a deviation level, which can quantify the mismatch between the expected supply chain parameters of a product specified by the supply chain plan and the observed supply chain parameters of the product. For example, the deviation level can quantify any of the differences between the planned parameters and the observed parameters, such as the difference between planned and actual customer demand, the difference between planned and actual supply, the difference between the planned and actual time, the difference between the planned and actual quantity of a product, and others. In one example embodiment, the deviation level can include a due period which specifies the number of days allowed for obtaining the product and a quantity of the product which specify the amount of the product that must be available by the end of the due period.

Example 10—Example Solution Analysis System

Figure 6:
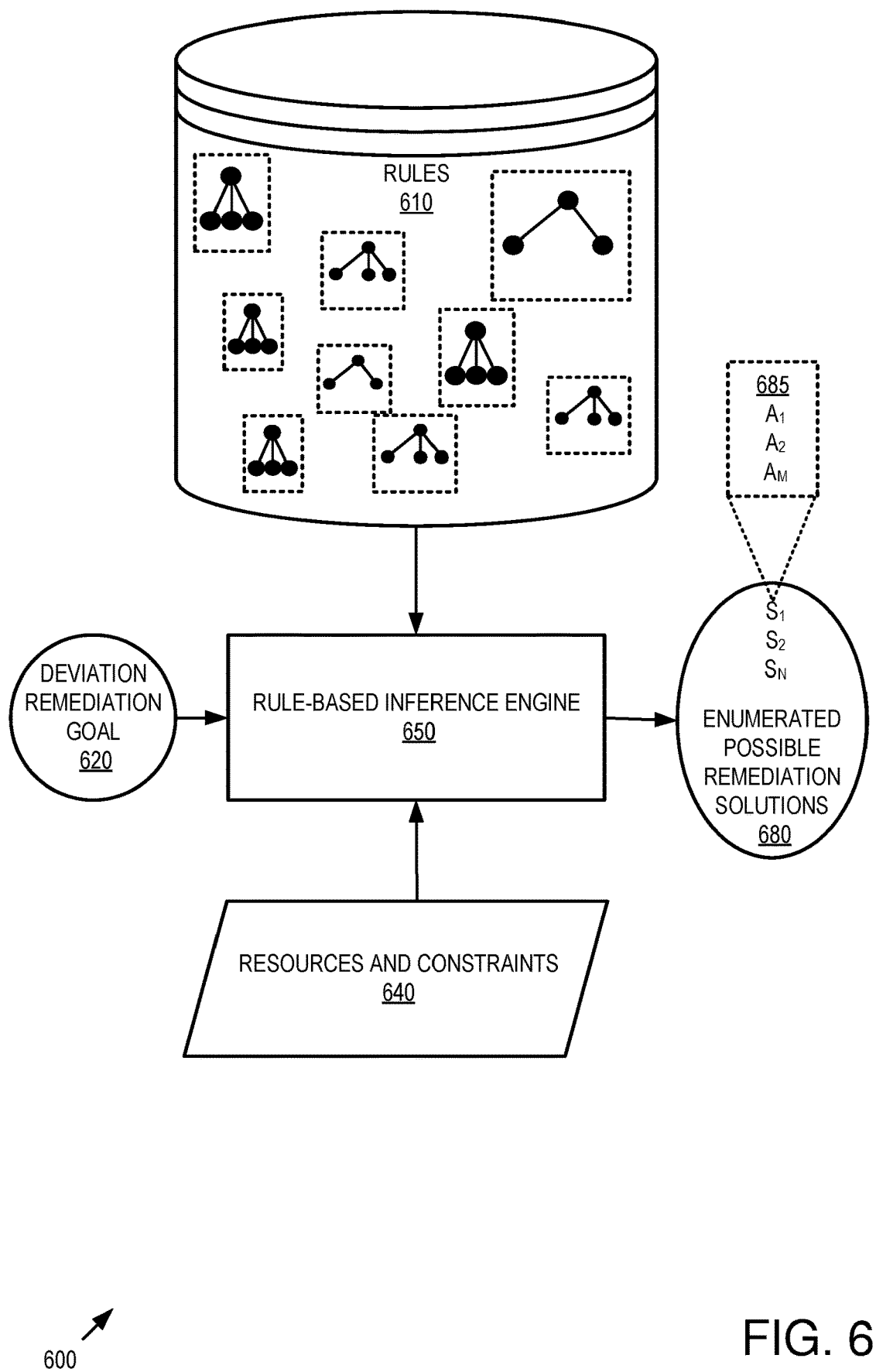
FIG. 6 is a block diagram of an example solution analysis system that tests a plurality of remediation solutions for correcting a mismatch between expected parameters and observed parameters of a product as indicated by a deviation remediation goal.

FIG. 6 is a block diagram of an example system 600 that tests a plurality of remediation solutions for correcting a mismatch between expected parameters and observed parameters of a product as indicated by a deviation remediation goal 620 and can be used in any of the examples herein for solution analysis (e.g., querying the rules for solutions).

In the example, a rule-based inference engine 650 is configured to receive a deviation remediation goal 620. The engine 650 outputs one or more enumerated possible remediation solutions 680 for correcting mismatch as indicated by the deviation remediation goal 620 (e.g., the solutions 680 satisfy the goal 620).

The rule-based inference engine processes the rules 610 and the resources and constraints 640. In some implementations, the rules 610 can be included in the resources and constraints 640 and/or the resources and constraints 640 can be encoded as rules 610.

As part of the solution analysis, the engine 650 can include an activity-based view 685 for respective of the solutions as described herein. Evaluation of a solution can comprise evaluation of the activities of the activity-based view of the solution as described herein.

Example 11—Example Solution Analysis Method

Figure 7:
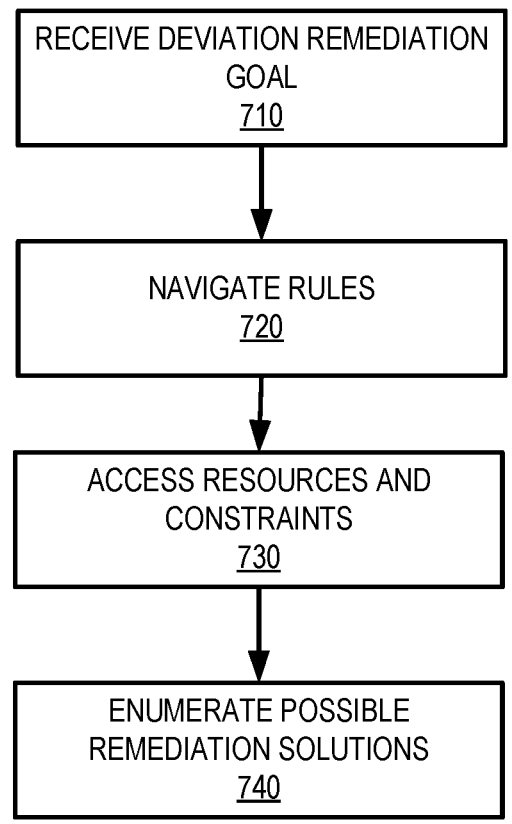
FIG. 7 is a flowchart of an example solution analysis method that tests a plurality of remediation solutions for correcting a mismatch between expected parameters and observed parameters of a product as indicated by a deviation remediation goal.

FIG. 7 is a flowchart of an example solution analysis method 700 that tests a plurality of remediation solutions for correcting a mismatch between expected parameters and observed parameters of a product as indicated by a deviation remediation goal and can be used in any of the examples herein for solution analysis, such as in system 600 of FIG. 6 (e.g., is performed by the engine 650).

In the example, at 710, a deviation remediation goal as described herein is received.

At 720, the rules are navigated. Terminology can vary based on the implementation. In one implementation, the goal is used to query the rules (e.g., find solutions to the goal by applying the rules to find successful paths through the goals to predicates that are satisfied by the resources and constraints), which control the way the resources and constraints are accessed 730. Another way to describe the navigation process is that instances of the rules are instantiated (e.g., actual values are applied to variables) as a search for solutions is performed.

At 740, the possible remediation solutions are then enumerated. As described herein, the solutions can be expressed in terms of the activities that accomplish the goal (e.g., the activities may consume/modify resources within the specified constraints if actually implemented).

Example 12—Example SCMS Rule

Figure 8:
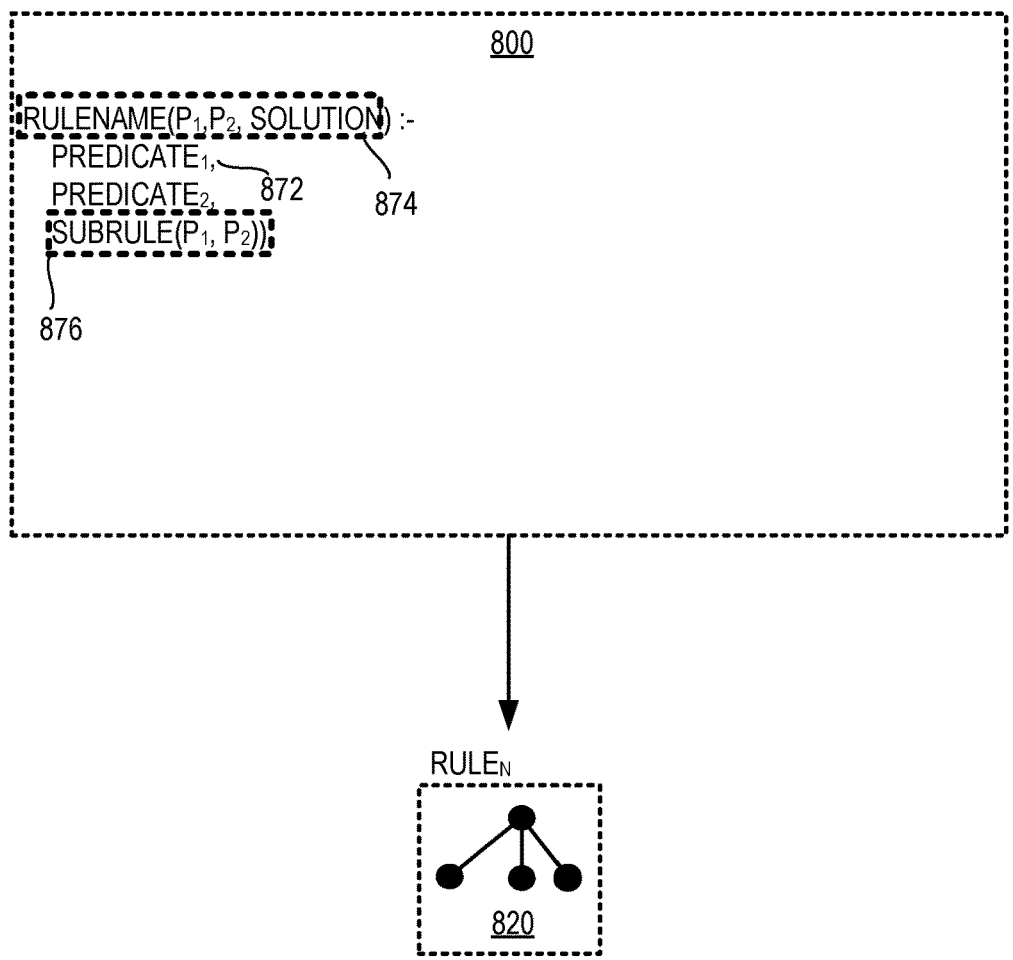
FIG. 8 is a block diagram of an example rule.

FIG. 8 is a block diagram of an example SCMS rule 800. In any of the examples herein, an SCMS Rule (or simply "rule") can be specified to indicate a remediation solution, partial remediation solution, or remediation subsolution as described herein. Declarative rules can be supported as described herein.

In practice, a rulename 874 is specified for the rule, along with various predicates 872 that must be met for the rule to evaluate as successful (e.g., true). A predicate can take the form of a subrule 876, which must be met for the rule to evaluate as successful. Although conjunctive predicates are shown (e.g., a logical AND is applied), disjunctive predicates can also be supported (e.g., a logical OR is applied). In practice, a mix of conjunctive and disjunctive predicates can be implemented.

For the sake of convenience, the rule is sometimes represented as a tree 820, with the rule name being the top, root node, and the predicates being the leaves. In practice, when a sub-rule is specified as a predicate, further branches of the tree can be added as shown in the examples herein.

The rules can be implemented in a declarative programming language, where the program logic is expressed in terms of relations that are represented as facts (e.g., resources and constraints) and rules. A query can be run over the relations. A declarative logic programming language such as Prolog can be used.

Example 13—Example Rule Relationships

Figure 9:
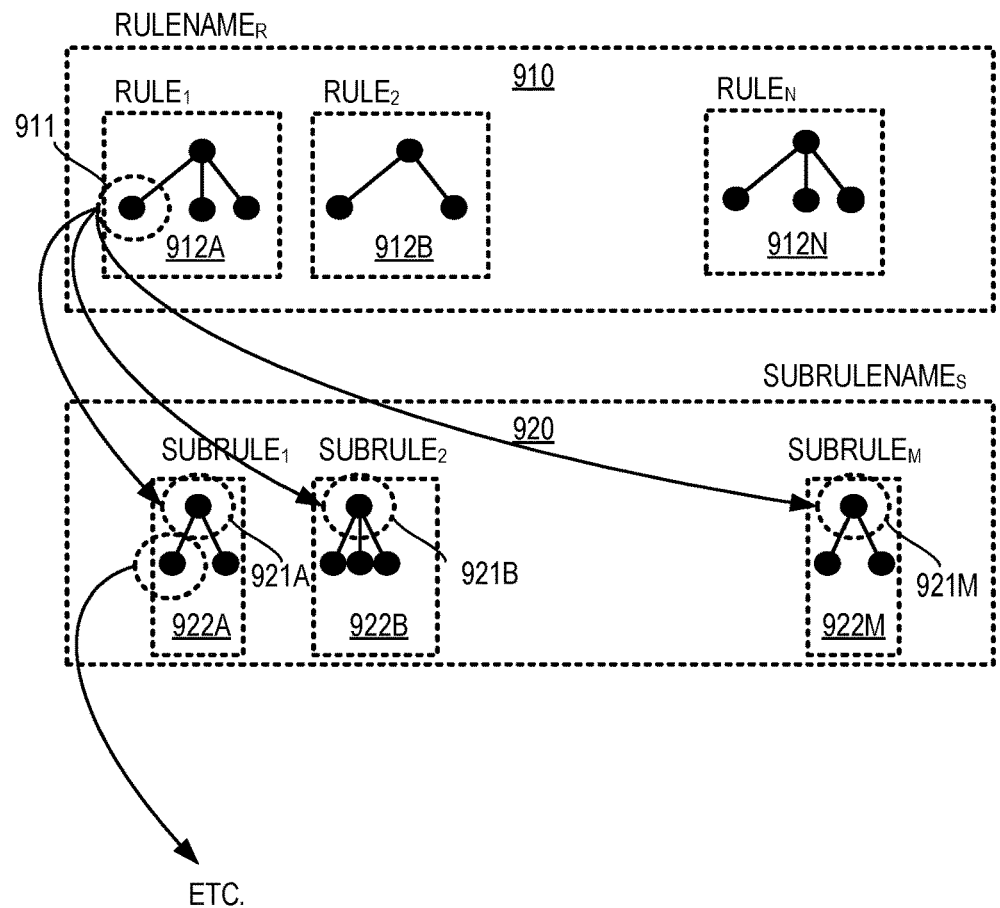
FIG. 9 is a block diagram of example supported relationships between rules and sub-rules.

FIG. 9 is a block diagram showing example supported relationships between rules and sub-rules that can be used in any of the examples herein.

In the example, there are multiple rules 912A-N with the same rulename (i.e., rulename$_r$). A goal may be specified in terms of a rulename. If so, any of the rules 911A-N may represent one or more solutions to the goal.

Such a relationship can also be applied to sub-rules 922A-M. For example, if a rule 912A specifies a sub-rule name in a predicate 911, any of the sub-rules 922A-M may represent one or more sub-solutions to the goal. So, when looking for solutions specified by the rule 912A, evaluation of multiple sub-rules 922A-922M can be performed. When depicted visually for explanation herein, the node 911 can be shown as alternatively fused with root nodes 921A, 921B, and 921M to form more complex trees. The complex trees are navigated to determine whether the respective solution is successful. The relationship can continue down to sub-sub-rules and so on.

As described herein, the path through the complex trees also defines a solution in terms of an activity-based view (e.g., the activities that accomplish the solution).

In practice, each of the predicates are tested until failure is found or if they are satisfied. For sake of efficiency, some predicates may be skipped (e.g., if it is impossible to satisfy the rule). In practice, any number of actual strategies can be implemented to determine whether the solution is successful. For example, the original query (e.g., goal) can be negated and a refutation can be attempted. If the negated query can be refuted, the solution is successful.

For purposes of understanding the rules, it can be said that if a predicate is true, the analysis continues down the path. But, in practice, evaluation can actually be implemented by determining that the predicate is not false.

In a Prolog implementation, identical heads for a plurality of rules can be specified, resulting in a plurality of possible solutions. Predicates can be in respective bodies of the rules.

As described herein, a predicate can be a simple condition or it can incorporate one or more other rules. Of note is that a rule having a rulename can itself specify the same rulename as a predicate, resulting in recursion.

Evaluation of the rules can implement chronological backtracking. For example, if navigation through a path proves to be unsuccessful, there may be a different path that is successful. When backtracking, variables altered (e.g., resources allocated, modified, or consumed) can be undone. For example, a rule may specify moving stock from one location to another and then increasing production. The stock may exist at the location, but increasing production may not be possible. If so, the stock is essentially "moved back" to its original location for further evaluation of the path.

In practice, multiple paths may be possible through the rules to success, resulting in a plurality of possible solutions. Attempting to program such scenarios with traditional iterative programming languages can prove to be difficult, and it is then very cumbersome to modify as well as typically beyond the skill level of the usual SCMS analyst. By implementing the described technologies, a rule can be changed easily to accomplish a change in business process or an increased understanding of logistics. Also, given the base system, rules can be easily written for any number of scenarios or enterprises, while still representing best practices as evolved within respective of the enterprises. In other words, the system can easily be customized to the particularities of any number of supply chain management (SCM) systems.

Example 14—Example Rule Analysis

Figure 10:
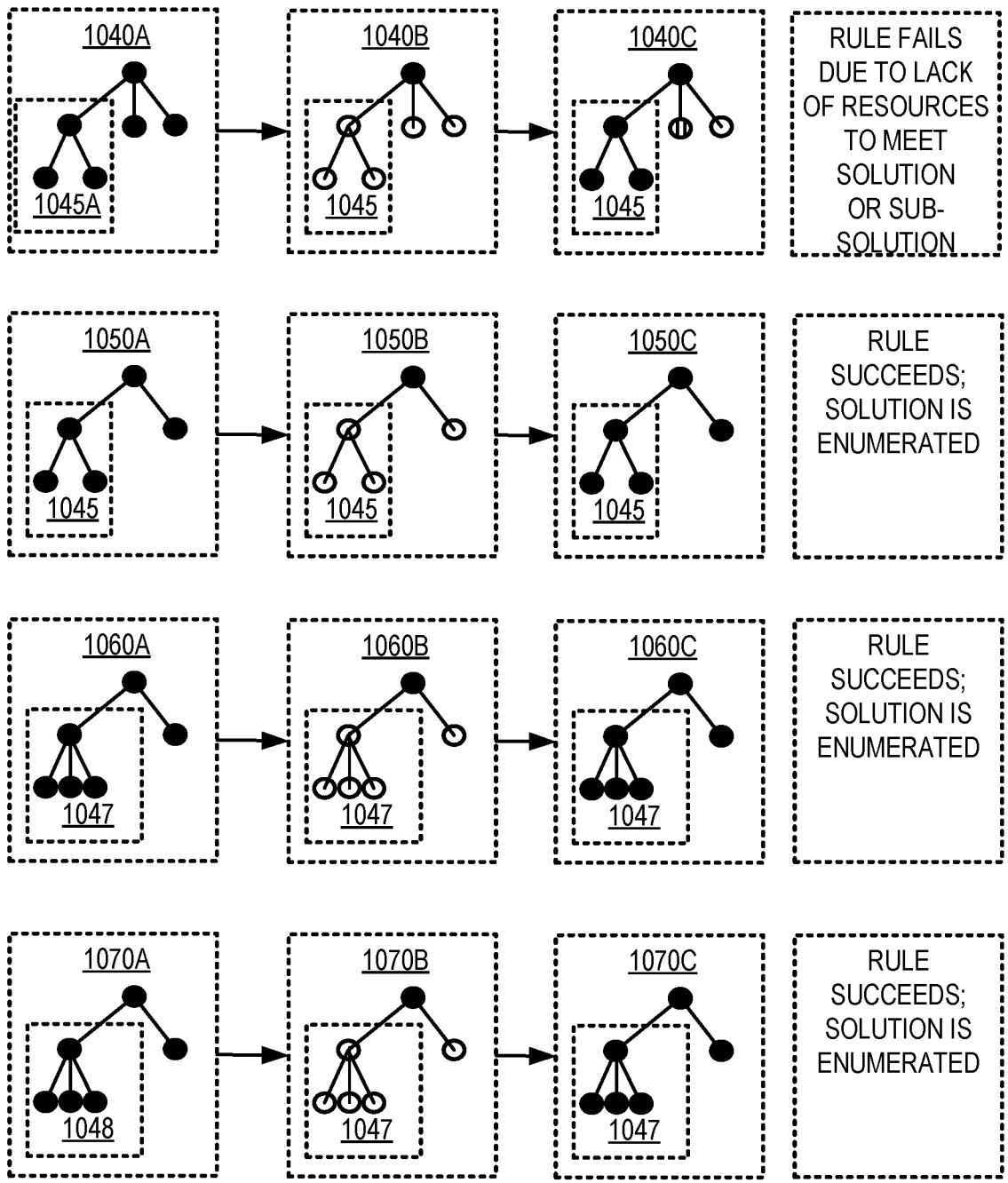
FIG. 10 is a block diagram showing analysis of a plurality of rules and enumerating successful solutions therefrom.

FIG. 10 is a block diagram showing analysis of a plurality of rules 1040A, 1050A, 1060A, 1070A and successful solutions enumerated therefrom.

In the example, a base rule of rule 1040A makes reference to a sub-rule 1045A. The base rule of rules 1050A, 1060A, 1070A makes reference to a sub-rule name that has three alternative sub-rules 1045, 1047, 1048, resulting in three different instantiations 1050A, 1060A, 1070A of the base rule.

At 1040B, 1050B, 1060B, 1070B, navigation begins at the root of the rule and proceeds down to the leaves, where predicates are tested against resources and constraints at 1040C, 1050C, 1060C, 1070C. In the example, navigation at 1040C indicates that the rule fails (is not successful) due to lack of resources to meet the solution or sub-solution. The other rules 1050C, 1060C, 1070C succeed, and the solutions are enumerated. The paths can be transformed into respective activity-based views as described herein.

The example shows how the rules herein support decomposition of a solution into one or more sub-solutions. The same sub-solution rules can be used across multiple more general solutions. Thus, configuration of the rules is made easier. There can be fewer overall changes (e.g., one change results in multiple changes of path navigation). The rules thus modularly represent the logic of SCMS remediation. Also, the rule evaluation can be done in parallel if desired, increasing overall performance.

Example 15—Example Combined Rules

Figure 11:
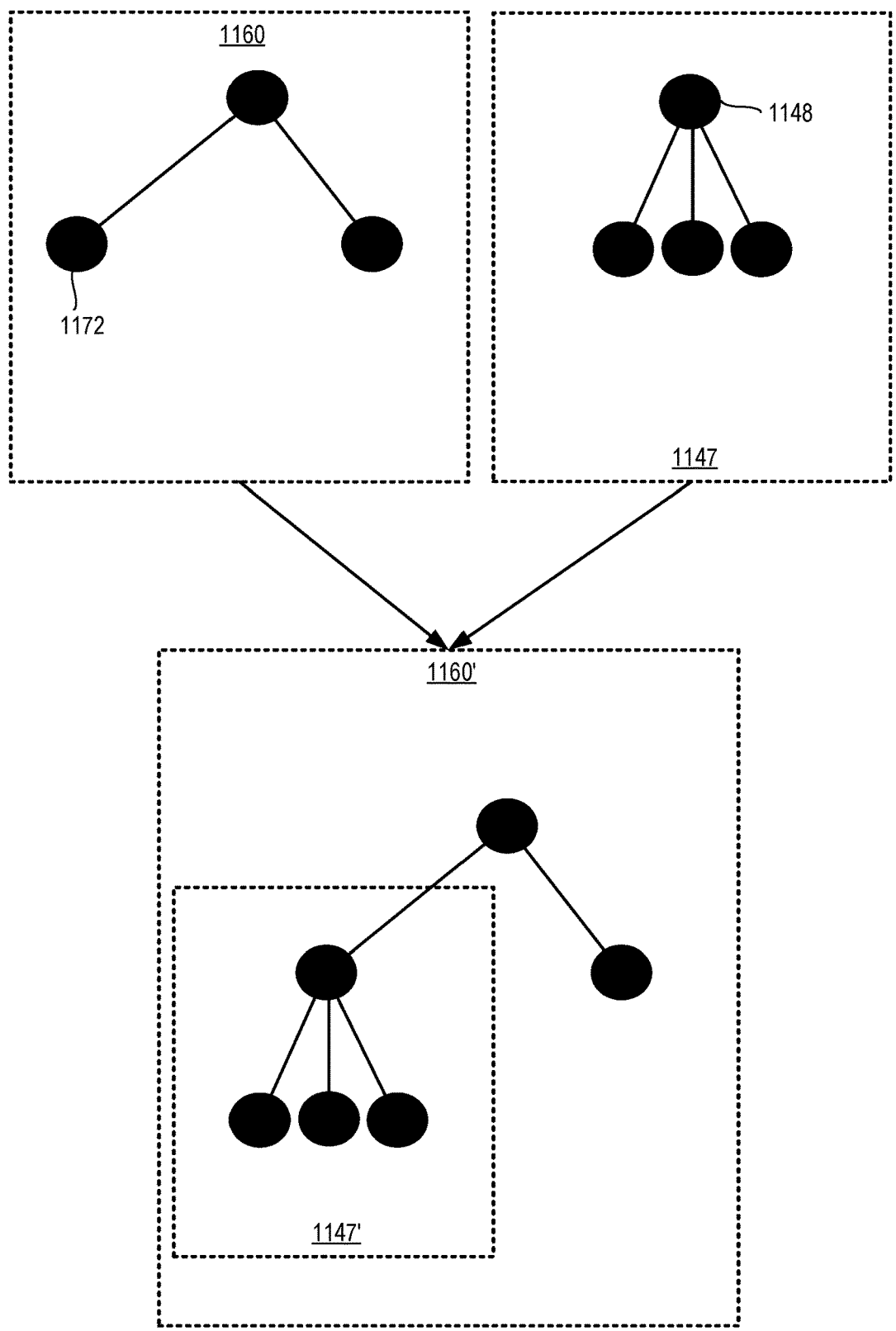
FIG. 11 is a block diagram showing an example combination of a rule and sub-rule.

FIG. 11 is a block diagram showing example combination of a rule 1160 and sub-rule 1147. In the example, the more general rule 1160 specifies a predicate 1172 that invokes the sub-rule 1147. The resulting combined rule 1160' fuses the predicate 1172 with the root 1148 so that an invocation of the rule 1147 is included within the combined rule 1160' as 1147'.

In practice, the more general rule 1160 and the sub-rule 1147 can use the same syntax. As described herein, predicates can be specified using AND, OR, or the like. Navigation of the combined rule 1160' results in a path. Visiting any of the rule nodes can contribute to the activity-based view, which can be built during navigation.

In practice, there can be more than one sub-rule instantiation per specification in a parent rule. For example, there may be multiple sub-rules with the same name as described herein.

Example 16—Example Activity-Based View

Figure 12:
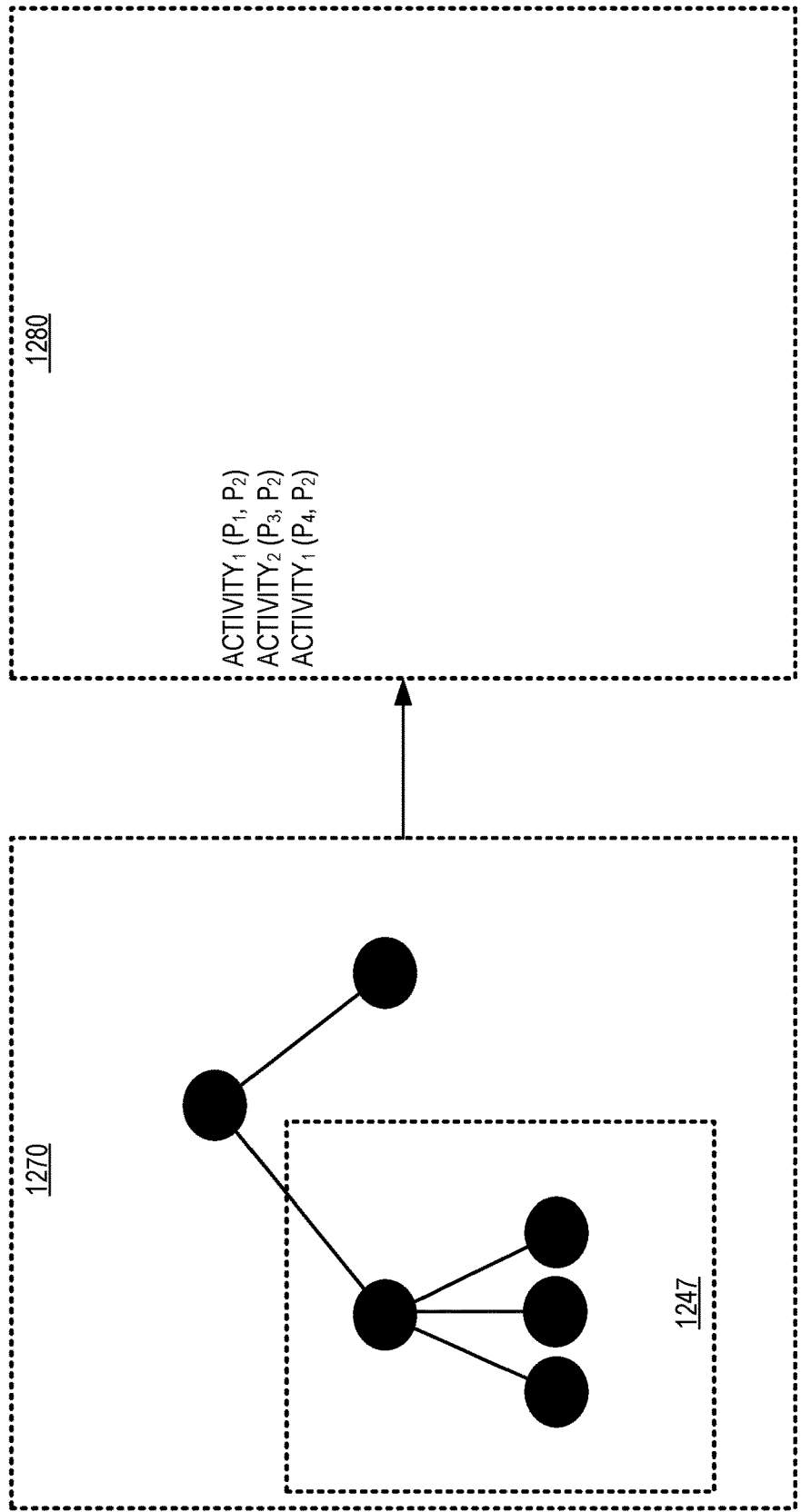
FIG. 12 is a block diagram showing example transformation of a successful path into an activity-based view.

FIG. 12 is a block diagram 1200 showing example transformation of a successful path into an activity-based view. In the example, navigation of the rule 1270 (e.g., a path through the nodes) results in generation of the activity-based view 1280, which lists specific activities that can comprise one or more specific parameters (e.g., numbers such as amount of product, location, etc.). For example, an activity can be to transport product stock from one location to another.

As nodes are traversed along a path in the rule 1270, the activity-based view can be generated. In this way, the successful path is transformed into an activity-based view 1280 as shown.

In a Prolog implementation, the solution can be submitted as a variable when invoking rules by a query as described below, and predicates can include an "append" function that incrementally builds the solution, which is returned when the rule is satisfied.

Example 17—Example Deviation Remediation Goals

In any of the examples herein, a deviation remediation goal can be generated by the decision support system responsive to a new plan deviation alert. As described herein, the deviation alert can include a deviation level that quantifies a mismatch between expected supply chain parameters of a product specified by a SCMS plan and observed SCMS parameters of the product. For example, an out-of-stock or too-low-stock alert can be generated that indicates a particular product, a location, and a stock level (e.g., how much product is projected as needed).

The deviation alert can be converted into a deviation remediation goal. In practice, such conversion can take the form of plugging the parameters of the alert into a rule query that is then applied against the rules. The query, then, is trying to find potentially successful solutions to the plan deviation (e.g., fix the shortage).

For example, in a Prolog implementation, a simple query can be:

?-demand(locmat([location], [material]), [date], [quantity], Solution).

In this example, the query contains a variable "Solution." The query aims to find all values for this "Solution" so as to achieve the deviation remediation goal, i.e., "a demand of [quantity] of [material] at [location] on [date]."

Using this query, Prolog can evaluate all rules to determine if they can satisfy their respective predicates. Since the above example query binds the last parameter of the rules to a variable, it can assume any value the rule tests it against.

The query can return a list of activities that lead to the "Solution." Rules that include sub-rules can use append predicate to add respective activities to the list of activities that are needed to achieve the sub-goals. In other words, the "append" function can extend the list of activities from the sub-goals with the activity of the current rule.

For example, FIG. 12 shows that if it takes $ACTIVITY_1$ (P4, P2) and $ACTIVITY_2$ (P3, P2) to achieve sub-goal 1247, rule 1270 can "append" $ACTIVITY_1$ (P1, P2) to the solution of sub-goal 1247 and this extended list of activities 1280 is what it takes to reach the goal 1270.

Another example Prolog query can be:

?-demand(locmat([location], [material]), [date], [quantity], [activityA]).

This query asks if [activityA] can meet the "demand of [quantity] of [material] at [location] on [date]."

Yet another example Prolog query can be:

?-demand(locmat([location], [material]), [date], [quantity], [activityA|Rest]).

This query includes a variable "Rest." The query aims to find all values for the variable "Rest," which represents a part of the solution to the "demand of [quantity] of [material] at [location] on [date]," and the solution must start with [activityA].

The queries can also include multiple variables. For example, the following query uses both "Quantity" and "Solution" as variables to find partial solutions to solve a material shortage problem.

?-demand(locmat([location], [material]), [date], Quantity, Solution), maximize(Quantity).

This query can return all partial solutions for the "demand of [material] at [location] on [date]" together with the maximum Quantity of the [material] available, even though the maximum Quantity available is not sufficient to satisfy the shortage of the [material].

Thus, satisfaction of the deviation remediation goal by any of the potential remediation solutions found by the rule-based search engine could correct the detected mismatch. It is then a matter of choosing one of the alternative remediation solutions.

For example, assuming a new plan deviation alert is generated that indicates a mismatch between the demand and supply of cheese dumpling combo, and the deviation level specifies the amount of cheese dumpling combo needed is 50 kg and the due period is 3 days. Then the generated deviation remediation goal can be producing at least 50 kg of cheese dumpling combo by 2018 Apr. 4 if today's date is 2018 Apr. 1.

Figure 13:
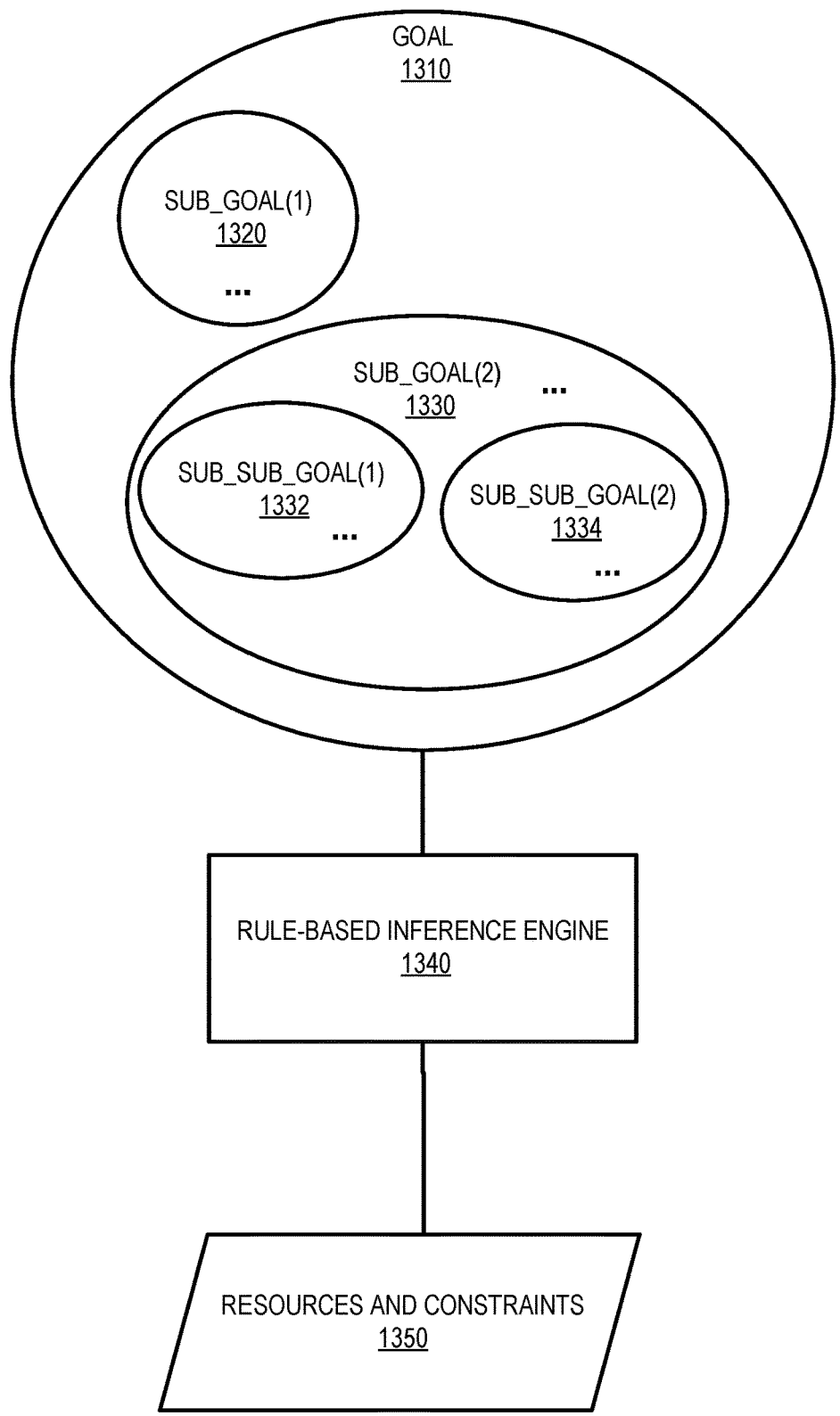
FIG. 13 is a schematic diagram illustrating an example relationship between deviation remediation goals, rules, and supply chain resources and constraints.
Figure 14:
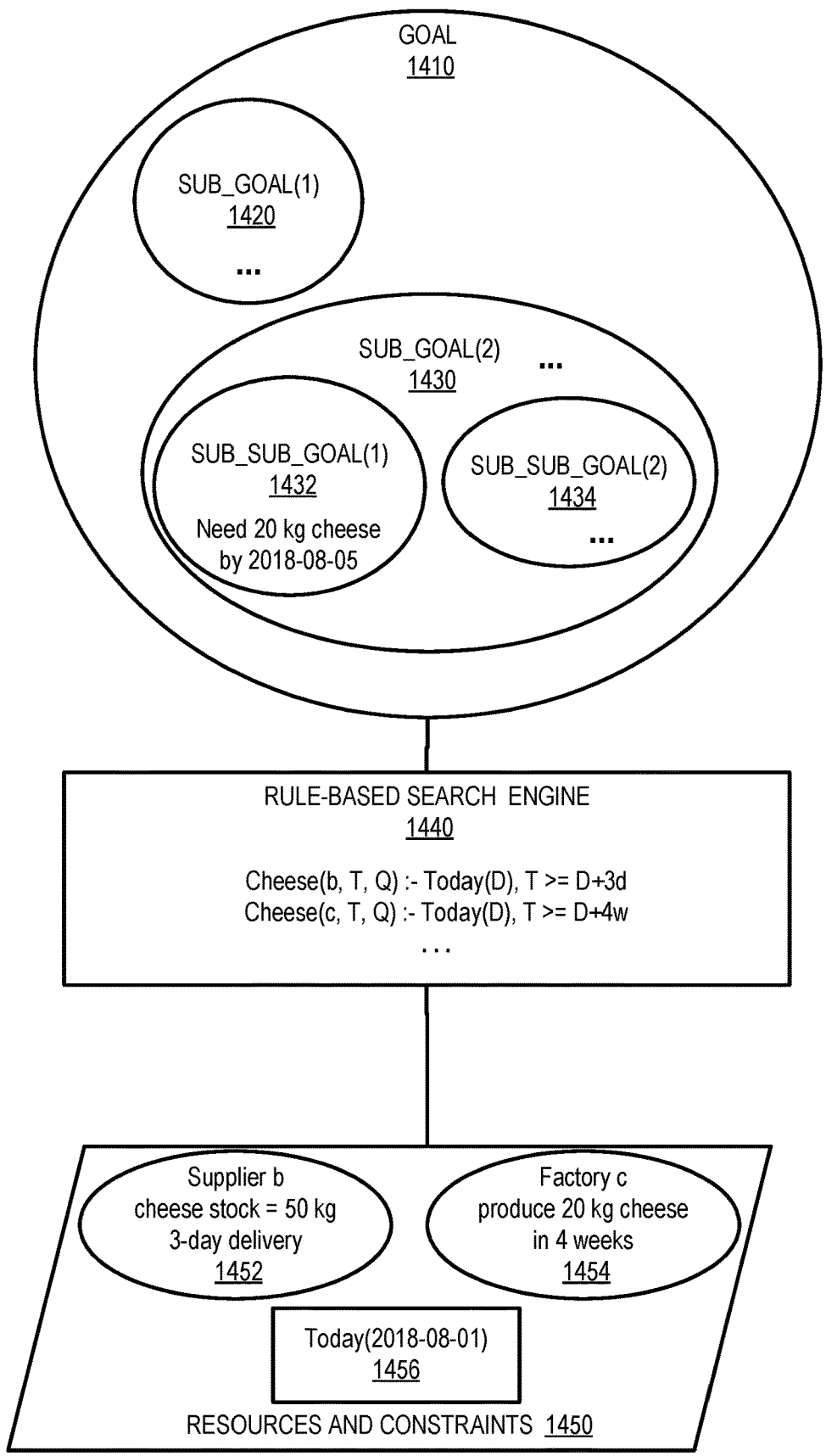
FIG. 14 is a schematic diagram depicting one specific example of the deviation remediation goals, rules, and supply chain resources and constraints.

The rules described herein can thus alternatively be described as goals as follows. As illustrated in FIG. 13 and FIG. 14, a deviation remediation goal 1310 (or 1410) can be divided into multiple sub-goals 1320, 1330 (or 1420, 1430) such that the deviation remediation goal 1310 (or 1410) is considered to be satisfied when its sub-goals 1320, 1330 (or 1420, 1430) are satisfied. For example, the deviation remediation goal of producing at least 50 kg of cheese dumpling combo by 2018 Apr. 4 may be divided into two sub-goals: sourcing at least 10 kg of cheese by 2018 Apr. 3 and sourcing at least 50 kg of dumplings by 2018 Apr. 3, assuming it takes one day to mix the sourced cheese and dumplings to produce the desired amount of cheese dumpling combo.

Division of the deviation remediation goal into sub-goals can be recursive. For example, the sub-goal 1330 (or 1430) may be further divided into sub-sub-goals 1332 and 1334 (or 1432 and 1434) such that the sub-goal 1330 (or 1430) would be satisfied when all its corresponding sub-sub-goals 1332 and 1334 (or 1432 and 1434) are satisfied.

Example 18—Example Rule Format and Syntax

FIG. 15 is a code listing depicting an example actual rule 1500. Any number of formats or syntaxes are possible. In the example, a rule includes a rulename ("DEMAND") in a head of the rule to the left of a delimiter (e.g., ":-"). The body of the rule can include one or more predicates that are separated by a delimiter (e.g., "," to indicate "AND"). The predicates can be simple conditions (e.g., "QUANTITYD #>0") or invoke other rules (e.g., including recursive invocations 1574). Activities 1576 (e.g., "TRANSPORT") can also be included by appending to the SOLUTION parameters as shown. Here, activities 1576 represents a part of the recursion/incremental assembly of the solution to achieve the deviation remediation goal. Once the sub-rules of a current rule can be fulfilled and their respective solutions are known, the solution of the current rule can be constructed by appending this rule's activities to the sub-rules' solutions.

In practice a wide variety of rules can be supported by a flexible system that can account for a large number of different scenarios. One advantage of using the described rules is that a business change (e.g., requiring inspection time for any transports) can be included as part of an applicable rule and then changed in one place to effect a change across the rules. Thus, one small change in the code (e.g., rules) can result in numerous changes within the analysis. Because the rules can be of a declarative form, they are more amenable to being understood and are more easily changed. A rule editor (e.g., SCM analyst) need not be familiar with iterative programming practices and the accompanying risks (e.g., thread-safe code) associated therewith.

Example 19—Example Rule Implementations

In any of the examples herein, the rules can define logical relationships between the resources and constrains of a supply chain. In some embodiments, the rules can be predefined in a SCMS. In some embodiments, the rules can be defined or edited by a supply chain planner or decision maker through a user interface. As described below, the rule-based search engine can instantiate a set of rules to link the deviation remediation goal (and its sub-goals, sub-sub-goals, etc.) and the supply chain resources and constraints.

In certain embodiments, the rules can be described in a logic programming language, such as Prolog. For example, the following Prolog statement describes a rule that the customer demand can be met if at least the requested amount (Q) of cheese dumpling combo is available from location A no later than time T:

DemandFulfillable(T, Q):-CheeseDumplingCombo(A, T', Q'), T'<=T, Q'>=Q.

Further examples are shown in FIG. 14, which illustrates that a rule-based search engine 1440 can initiate a set of rules that link the sub-sub-goal 1432 to the supply chain resources and constraints 1450. In this example, the sub-sub-goal 1432 indicates a need of 20 kg cheese by date 2018 Aug. 5. The resources and constraints (e.g., 640) include at least the following data: supplier b has a cheese stock of 50 kg which can be delivered within 3 days, factory c has a production capacity of producing 20 kg of cheese within 4 weeks, and today's date is 2018 Aug. 1.

Thus, there are at least two options that potentially can meet the sub-sub-goal 1432: to source 20 kg cheese from the supplier b, or to produce 20 kg cheese from factory c. Accordingly, the rule-based search engine 1440 can instantiate a set of rules that include at least the following statements:

Today(2018 Aug. 1).
Cheese(b, T, Q):-Today(D), T>=D+3d, Q<=50.
Cheese(c, T, Q):-Today(D), T>=D+4w, Q<=20.

Inquiry of the resources and constraints 1450 using the first rule will return a "yes" result because the cheese stock (50 kg) in supplier b is more than requested amount (20 kg) and the time constraint on T can be met because today +3 days is earlier than T. On the other hand, inquiry of the resources and constraints 1450 using the second rule will return a "no" result because although factory c can produce 20 kg of cheese, the production will not complete until 4 weeks later, after the due date.

Example 20—Example Method of Rule-Based Search

Figure 16:
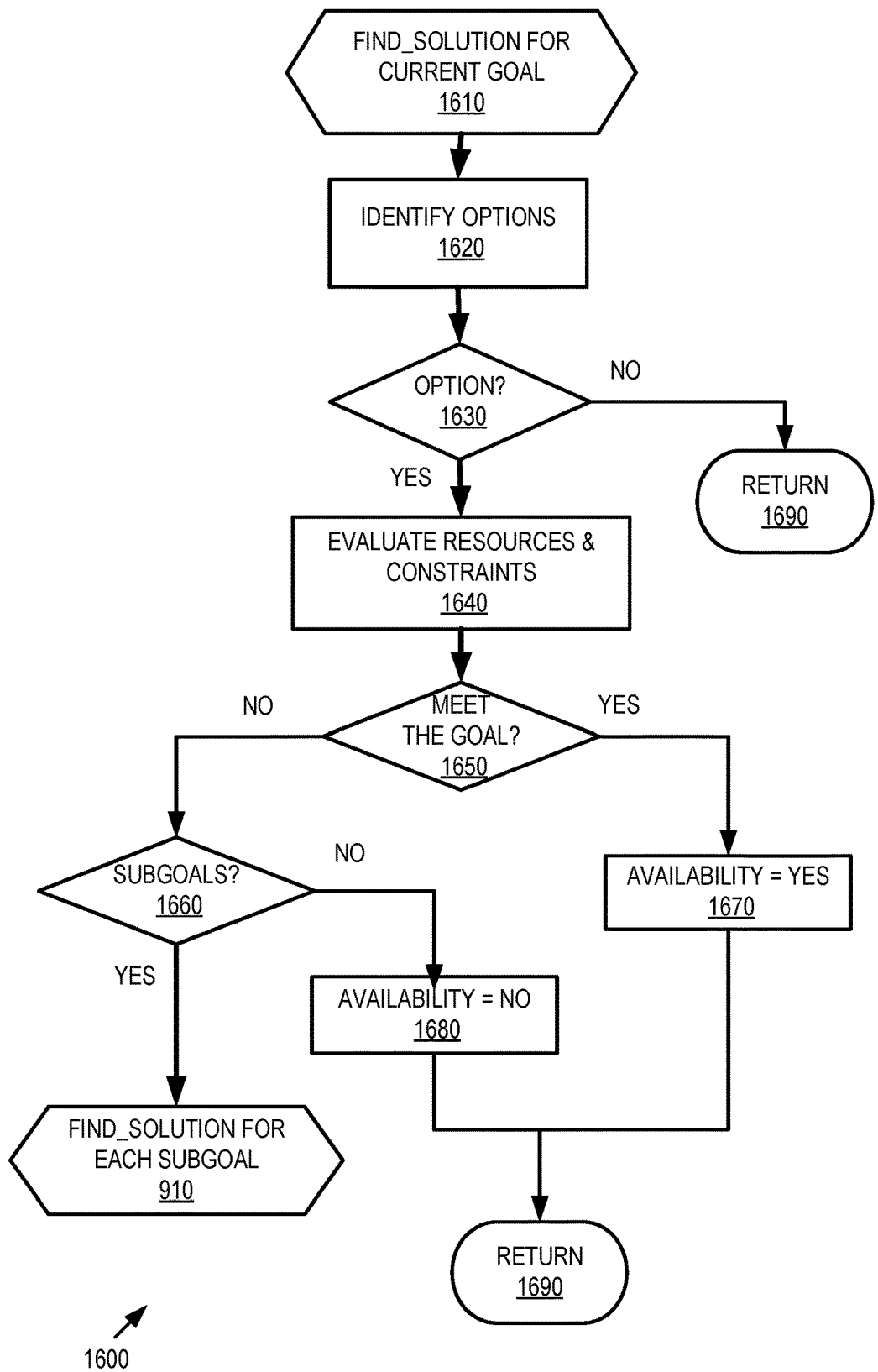
FIG. 16 is a flowchart of an example method of performing a rule-based search to find potential remediation solutions.

FIG. 16 is a flowchart of an example method 1600 of performing a rule-based search to find potential remediation solutions. Such a method 1600 can be used to achieve applying a query against the rules and/or performing rule analysis as described herein.

At 1610, the method 1600 calls function FIND_SOLUTION to find potential remediation solutions that can satisfy a current goal (e.g., the plan deviation goal, or its sub-goals, etc.).

At 1620, the method 1600 can identify the available options to achieve the current goal. For example, as noted above, one option to obtain a certain amount of a product by a certain date may be to source the product from one supplier, and another option may be to manufacture the product in a factory. The options may not be limited to these two. For example, the supply chain may have many suppliers or factories from which to choose. Alternative options may also be available, e.g., moving an inventory of the product originally planned for another goal to meet the current goal (e.g., by priority adjustment of different customer demands).

At 1630, the method 1600 can evaluate the available options. When the options are evaluated, the function call to FIND_SOLUTION can return at 1690. If there is at least one option, then at 1640, the method 1600 can evaluate the supply chain resources and constraints under that option.

Based on such evaluation, at 1650, the method 1600 can determine if the current goal can be directly satisfied with the existing resources and constraints. If the answer is yes, then the method can label at 1670 that a potential remediation solution is available to meet the current goal under this option. For example, if the current goal is to obtain 50 kg cheese dumpling combo within 3 days at factory A, and the factory A already has an inventory of or has the production capacity to produce 50 kg cheese dumpling combo that within the next 3 days, then the current goal can be directly met, without seeking recourse from other suppliers or factories. If the rule decides to use the inventory, then a "reservation" activity would be generated. On the other hand, if the rule chooses production, then a "production" activity would be added.

On the other hand, if the current goal cannot be directly satisfied based on the existing resources and constraints, the method 1600, at 1660, can determine if the current goal can be transformed into another goal or divided into two or more sub-goals. For example, transporting a supply from location B to location A may solve the supply shortage problem at location A, but meanwhile create a supply shortage problem at location B. In another example, if factory A does not have sufficient inventory to meet the current goal directly, but factory A can potentially meet the current goal by obtaining sufficient amount of cheese and dumplings separately from two suppliers B and C, then the current goal can be divided into two sub-goals: (1) to source certain amount of cheese from supplier B by a certain date, and (2) to source certain amount of dumplings from supplier C by a certain date.

If the current goal is not divisible, then the method can label, at 1680, that the potential remediation solution is not available to meet the current goal under this option. Otherwise, for each of the sub-goals, the method 1600 can recursively call the function FIND_SOLUTION to find all potential remediation solutions that can satisfy the respective sub-goals.

Example 21—Example Method of Constructing a Recursive Backward Chain

The example method 1600 described above can create a recursive backward chain, which can be further illustrated by an example described below and in reference to FIGS. 17-18.

Figure 17:
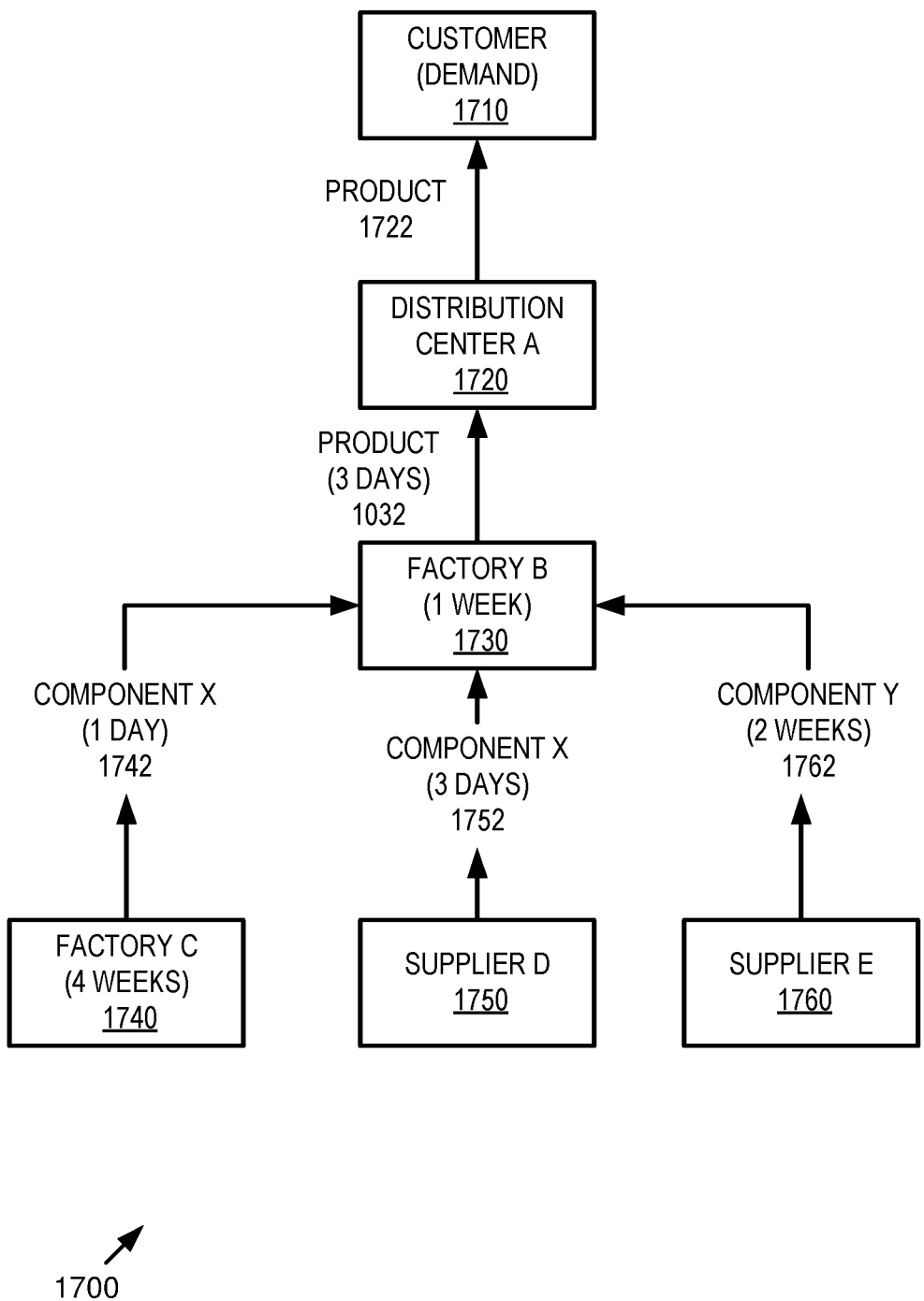
FIG. 17 is a diagram illustrating one example model of a supply chain with a plan deviation and corresponding resources and constraints.

FIG. 17 is a diagram illustrating one example model of a supply chain 1700 with a plan deviation and corresponding resources and constraints. In this example supply chain, the customer demand 1710 of a product 1722 requested from distribution center A can generate a new plan deviation alert. This can occur, for example, if distribution center A does not have any planned inventory of the product 1722 that can meet the customer demand 1710. Distribution center A can obtain the product from factory B. It takes 1 week for factory B to manufacture the product and an additional 3 days to deliver the product from factory B to distribution center A. To manufacture the product, factory B needs two components X and Y. Component X can be produced from factory C which will take 4 weeks to produce and 1 day for delivery, or sourced directly from supplier D which will take 3 days for delivery. Component Y can be sourced directly from supplier E, which will take 2 weeks for delivery.

Figure 18:
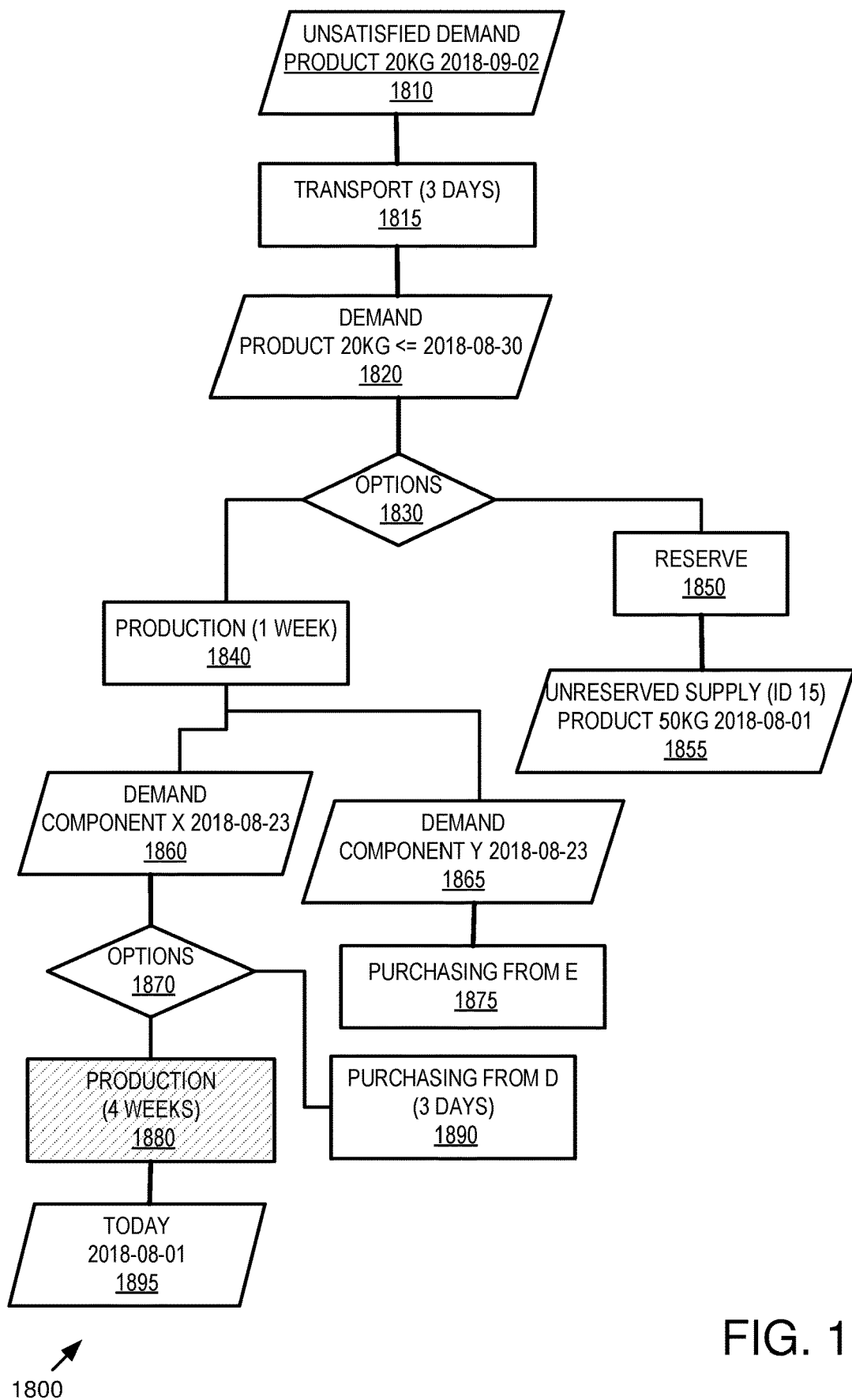
FIG. 18 is an example tree diagram illustrating the concept of constructing a backward chain based on the supply chain model depicted in FIG. 17.

FIG. 18 is an example tree diagram 1800 that illustrates the concept of constructing a backward chain to find potential remediation solutions that may solve the plan deviation depicted in FIG. 17. Backward chaining is a logical process of inferring unknown truths from known conclusions by moving backward from a solution to determine the initial conditions and rules. As described below, the rule-based search engine can create the tree diagram 1800 by means of backward chaining to find the supply chain resources (under constraints) and rules that can satisfy the goals.

In this example, the plan deviation goal is to meet the customer demand 1810: distribution center needs to obtain 20 kg of the product by 2018 Sep. 2. Because the transport 1815 from factory B to distribution center A takes 3 days, the demand 1820 created for factory B is producing 20 kg of the product before 2018 Aug. 30. There are two options 1830 that can potentially meet such demand. One option is to obtain the product from factory B's reserve 1850, if it is available. In this example, factory B happens to have 50 kg of unreserved supply 1855 of the product that is available from 2018 Aug. 1. Thus, this can be a feasible solution to meet the demand. Another option is to produce 1840 the product in factory B, which will take 1 week. To make such production, factory B needs to create two new demands. One demand 1860 is to obtain sufficient amount of component X by 2018 Aug. 23, and another demand 1865 is to obtain sufficient amount of component Y by 2018 Aug. 23. There are two options 1870 that may potentially satisfy the demand 1860. One option is to order production 1880 of component X from factory C. This is not feasible because such production will take 4 weeks and today's date 1895, 2018 Aug. 1, is less than 4 weeks from the demanded due date 2018 Aug. 23. Another option is to purchase component X directly from supplier D. This option is feasible because it only takes 3 days. The other demand 1865 can be satisfied directly by purchasing Y directly from supplier E. Although it takes 2 weeks to deliver component Y from supplier E to factory B, it is deemed feasible because there is sufficient time between today's date and the demanded due date 2018 Aug. 23. As described herein, all demands 1820, 1860, 1865 can be expressed by rules instantiated by the rule-based search engine.

Example 22—Example Potential Remediation Solutions

In any of the examples herein, the potential remediation solutions refer to any solutions, given the existing supply chain resources and constraints, can meet the plan deviation goal. By constructing a recursive backward chain as discussed above, the rule-based search engine can find all potential remediation solutions that can potentially correct the detected plan deviation. As noted above, the rule-based search can be recursive by dividing a goal into sub-goals, and a potential remediation solution meeting the goal must simultaneously meet all its sub-goals. In addition, a rule-based search can be exhaustive by examining all possible options to meet a goal. Thus, the full set of potential remediation solutions can be expansive.

Figure 19:
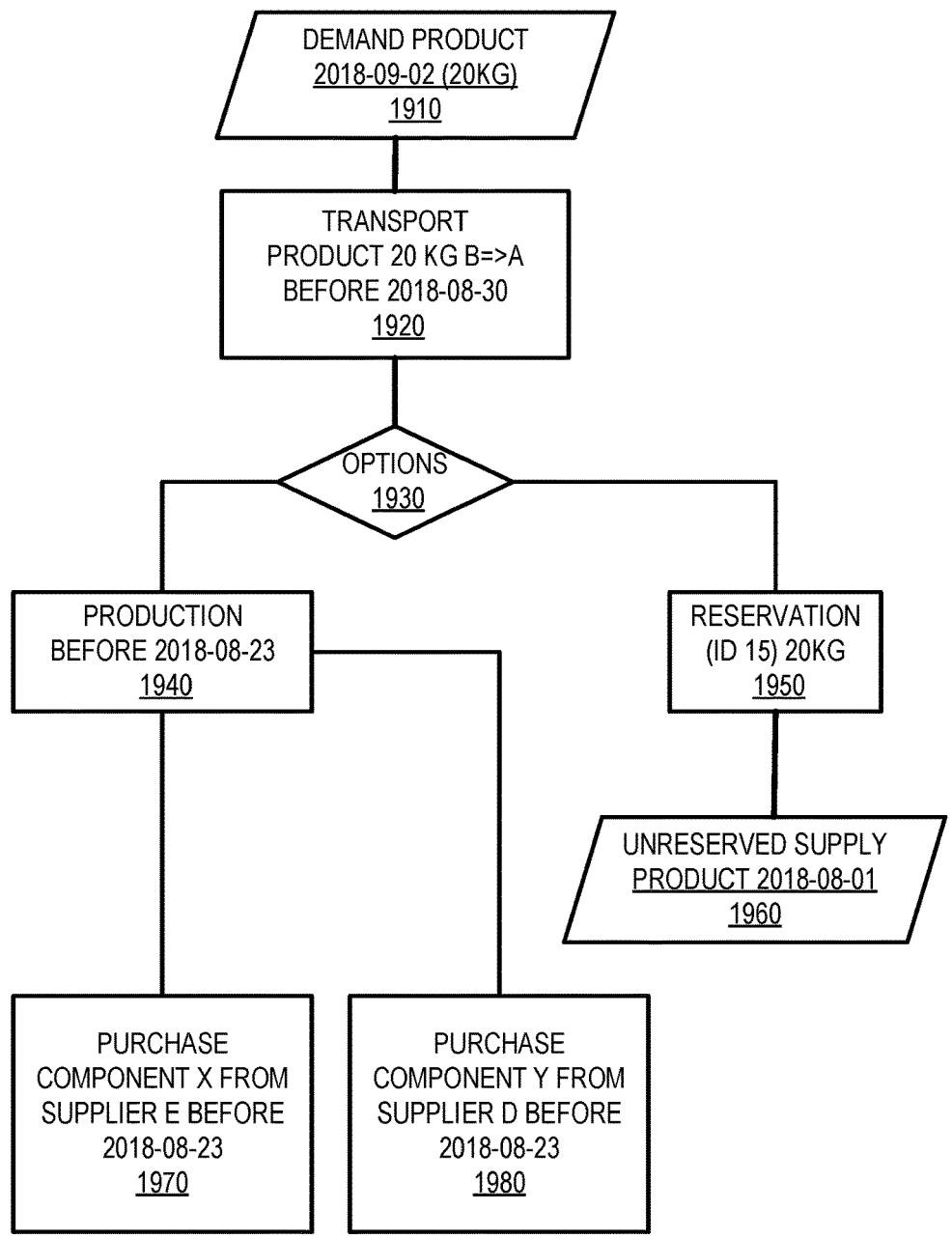
FIG. 19 is a tree diagram illustrating multiple potential solutions corresponding to FIG. 17.

FIG. 19 is a tree diagram 1900 illustrating multiple potential remediation solutions corresponding to FIGS. 17-18. Non-feasible options in FIG. 18 are removed from the tree diagram 1900.

For example, the plan deviation goal of meeting the demand 1910 (i.e., need 20 kg product by 2018 Sep. 2) can be satisfied by transportation 1920 the product from factory B to distribution center A before 2018 Aug. 30. This can be achieved by one of two options 1930. In one option 1940, the product can be produced by factory B before 2018 Aug. 23, which can be achieved by purchasing component X 1970 from supplier E before 2018 Aug. 23 and purchasing component Y 1980 from supplier D before 2018 Aug. 23. The second option 1950 is to make a reservation from factory B, whose inventory 1960 is sufficient to meet the demand.

Figure 20A:
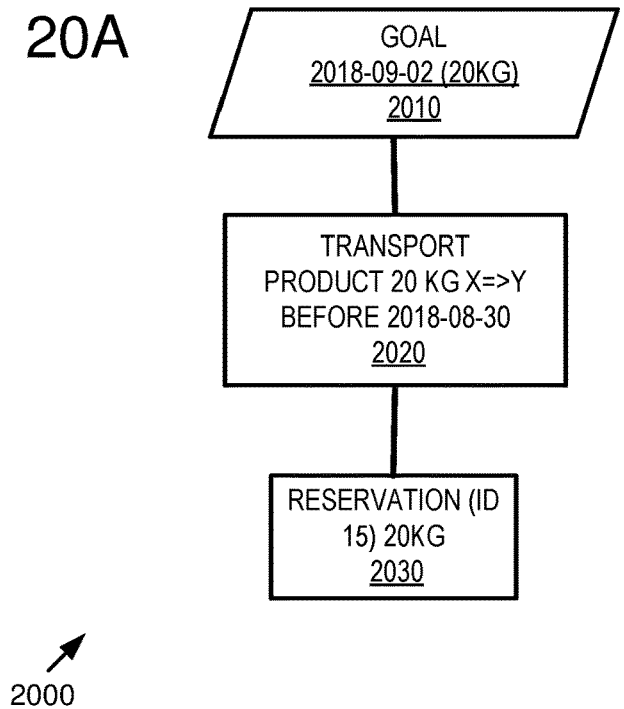
FIG. 20A and FIG. 20B are separate tree diagrams respectively illustrating two potential solutions corresponding to FIG. 17.
Figure 20B:
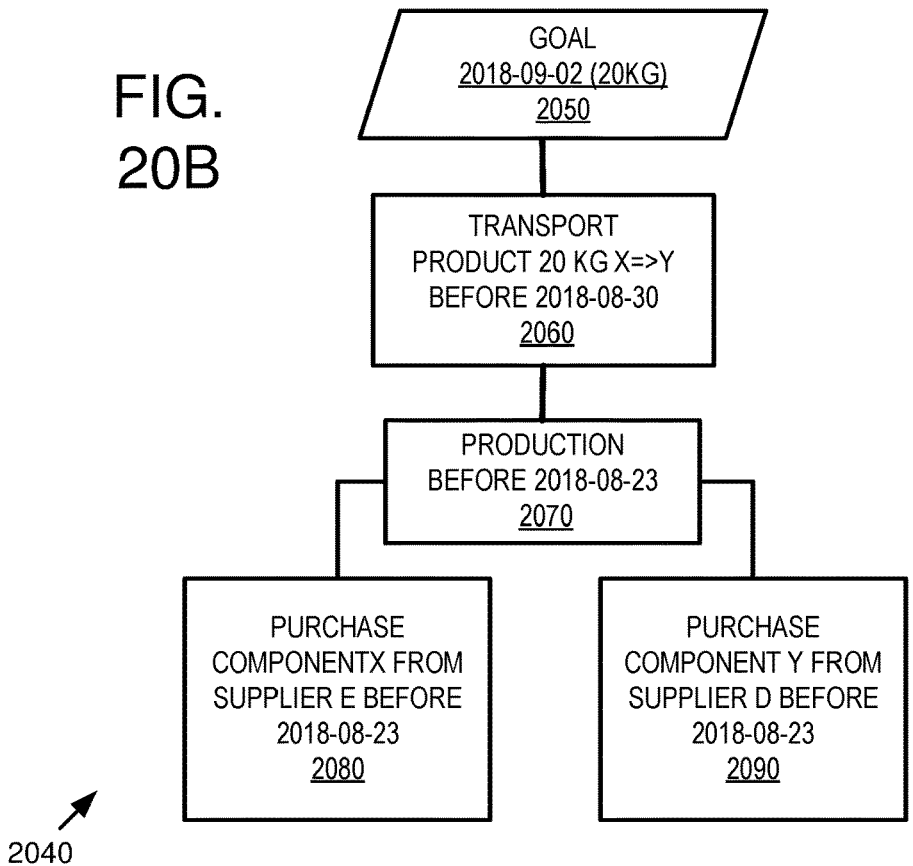

FIGS. 20A-20B respectively show two separate tree diagrams 2000, 2040, which represent two potential remedial solutions, respectively. For the first option, to meet the plan deviation goal 2010, a reservation 2030 of the product can be made from factory B, and the reserved product can be transported 2020 from factory B to distribution center A. For the second option, to meet the plan deviation goal 2050, factory B can purchase component X from supplier E 2080 and purchase component Y from supplier D 2090, then using the purchased components to produce the product at factory B 2070, and then deliver the finished product from factory B to distribution center A 2060.

Example 23—Example Candidate Remediation Solutions

As discussed above, the rule-based search engine may find multiple options to meet the plan deviation goal, which can be further divided into multiple sub-goals. Because the rule-based search process is recursive, the total number of potential remediation solutions can grow exponentially as the number of options and/or the number of sub-goals increase. Accordingly, it could become overly burdensome or overwhelming if all potential remediation solutions are presented to the supply chain planner or decision maker to determine which solution should be selected to solve the plan deviation problem.

In any of the examples herein, the candidate remediation solutions refer to a subset of the potential remediation solutions that are suggested by the rule-based decision support system.

As noted above, the rule-based decision support system can include a remediation simulator (e.g., 140, 240 in FIGS. 1-2) configured to simulate implementation of the potential remediation solutions. For example, the remediation simulator can simulate each of the two potential remediation solutions represented by the tree diagrams 2000, 2040 depicted in FIGS. 20A-20B. The simulation can take into account supply chain resources and constraints, such as the cost information regarding material, labor, inventory, delivery, etc. Based on the simulation results, the remediation simulator can evaluate the projected expended resources associated with each of the potential remediation solutions. The expended resources can be represented in a variety of measures, such as the financial cost in dollar amount, the disturbance to other planned activities (e.g., solving the current plan deviation may cause other plan deviations), the usage of labor or inventory, etc. Those measures can be used independently or in conjunction.

As described above, the rule-based decision support system can include a remediation advisor (e.g., 150, 250 in FIGS. 1-2) configured to evaluate the potential remediation solutions together with the projected expended resources. Based on such evaluation, the remediation advisor can generate a ranked list of candidate remediation solutions out of the full set of potential remediation solutions. A candidate remediation solution with lower projected expended resources can be ranked higher in the list. The ranks of the candidate remediation solutions can be represented by stars, scores, color codes, or the like.

The candidate remediation solutions can be presented on a user interface for the supply chain planner or decision maker to review and select. In an example embodiment, candidate remediation solutions can include only those potential remediation solutions whose projected expended resources are below a predefined threshold. In another example embodiment, only a maximum number (N) of candidate remediation solutions that are on top of the ranked list are presented on the user interface, where N can be a user-defined number.

Example 24—Example Selected Remediation Solution

In any of the examples herein, the selected remediation solution refers to one of the candidate remediation solutions that is selected by the supply chain planner or decision maker through the user interface. The supply chain planner or decision maker can review the candidate remediation solutions, including their rankings, the projected expended resources, and the corresponding solution tree diagrams (similar to those depicted in FIGS. 20A-20B). The supply chain planner or decision maker can further take into account other information that may not be available in the database. For example, resources and constraints may not have been updated in the database and thus not considered or evaluated by the rule-based search engine, the remediation simulator, or the remediation advisor. Based on such review, the supply chain planner or decision maker can make a more informed decision to select one of the candidate remediation solutions. The selected remediation solution can then be initiated by the system for execution.

Example 25—Example Experience Repository

In any of the examples herein, an experience repository can take the form of a simple data file or a large database, which can be locally stored or cloud-based. The experience repository can be integrated with, or independent of, the rule-based decision support system.

The experience repository can be configured to store the whole experience of the rule-based decision support system. Together with a semantic reasoning engine, the experience repository can form a part of an expert system that is configured to adaptively learn from past experience and provide more intelligent decision support. As described above with reference to FIG. 2 and FIG. 5, incorporation of such expert system may allow the rule-based decision support system to bypass some of the operational steps and improve the overall efficiency of its decision-making process. Further, such expert system can automatically adapt to the fast changing dynamics of the supply chain, e.g., the daily variation of the supply chain resources and constraints, and the unforeseeable changes in customer demand and supplies.

In an example embodiment, the experience repository can be configured to store any new and previous plan deviation alerts and the selected remediation solutions corresponding to those plan deviation alerts. Additional information can be stored in the experience repository as well, including any of the intermediate results such as the full set of the potential remediation solutions, the expended resources associated with the potential remediation solutions, the ranked list of candidate solutions and their respective rankings, the solution tree diagrams corresponding to the candidate solutions, etc. In addition, the actual outcome of the selected or initiated remediation solution can be added to the experience repository. The actual outcome can include both quantitative data (e.g., a Boolean value indicating whether the selected or initiated remediation solution succeeds or fails to correct the plan deviation, the actual cost of initiating the remediation solution, etc.) and qualitative data (e.g., a textual description of the efficiency or overall impact of the selected or initiated remediation solution, etc.).

In an example embodiment, the data stored in the experience repository can be accumulative since the installation of the rule-based decision support system. In an alternative embodiment, the experience repository can be configured to store only the data occurred in a selected period (e.g., the most recent six months). In certain embodiments, the supply chain planner or the decision maker can configure the experience repository for storing only certain types of data, or data corresponding to certain types of plan deviation alerts. In certain embodiments, the supply chain planner or the decision maker can edit the experience repository.

Example 26—Example Method of Identifying Precedents

Figure 21:
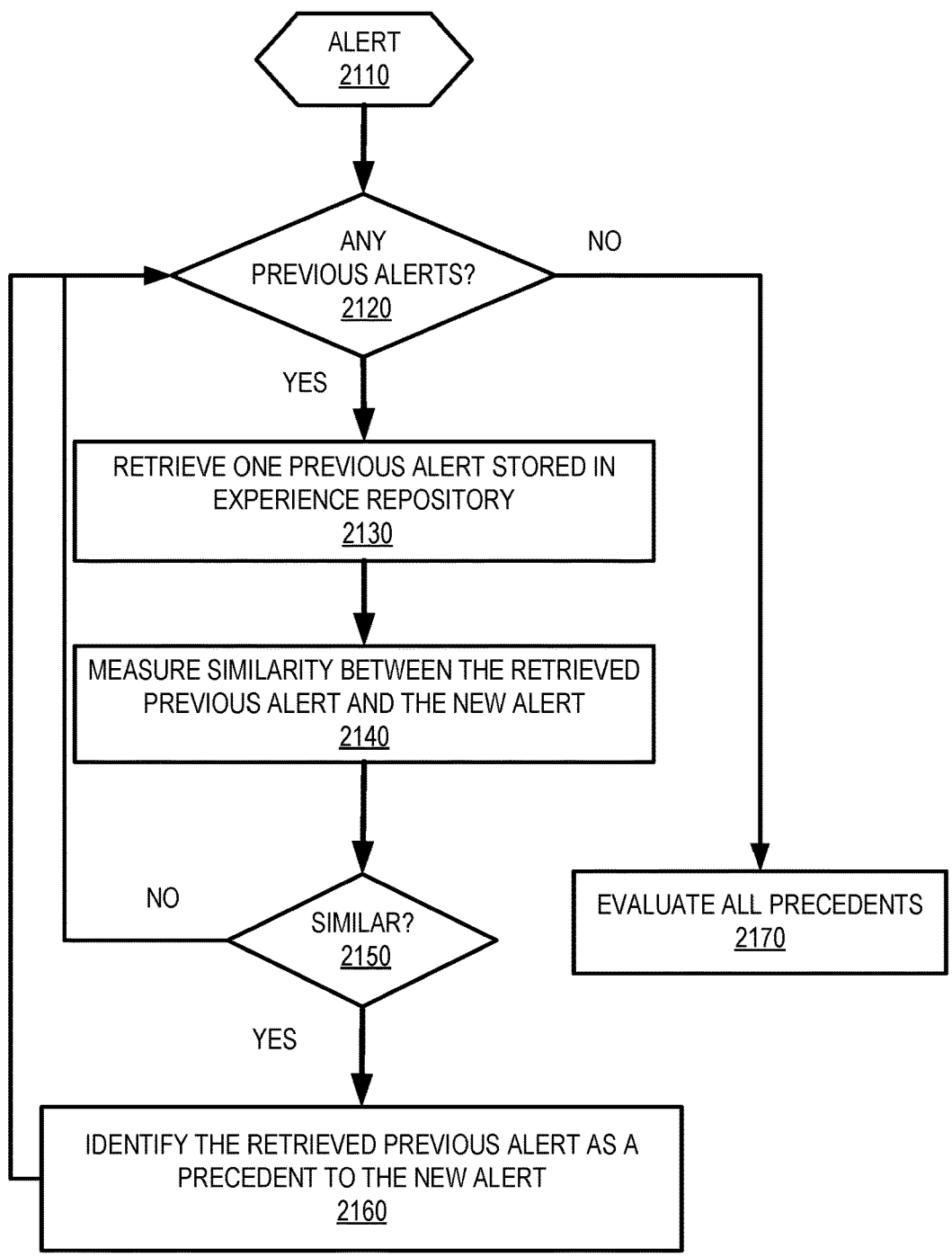
FIG. 21 is a flowchart of an example method of finding precedents of a plan deviation alert.

As described above, the semantic reasoning engine can identify precedents of the new plan deviation alert in the experience repository. FIG. 21 is a flowchart of an example method 2100 that can be implemented by the semantic reasoning engine to find precedents of a new plan deviation alert.

Responsive to a new plan deviation alert at 2110, the semantic reasoning engine can check the experience repository at 2120 for any previous plan deviation alerts stored therein. If yes, then the semantic reasoning engine can retrieve one previous plan deviation alert from the experience repository at 2130, and then measure the similarity between the retrieved previous plan deviation alert and new plan deviation alert at 2140. As described in the following section, the similarity can be measured using a plan deviation map. The measured similarity result can be evaluated at 2150. If the previous plan deviation alert is not similar to the new plan deviation alert, then the semantic reasoning engine can return to 2120 and check for other previous plan deviation alerts. If they are similar, then at 2160, the retrieved previous plan deviation alert can be identified as a precedent to the new plan deviation alert. Then the semantic reasoning engine can return to 2120 and check for other previous plan deviation alerts. Such process can iterate until all previous plan deviation alerts stored in the experience repository are evaluated. Then at 2170, the semantic reasoning engine can proceed to evaluate all identified precedents.

In addition to identifying precedents of a new plan deviation alert, the experience repository can also be used to identify recurring alerts, the feature of which has the potential to identify root cause and decrease the likelihood of plan deviations. For example, if the experience repository shows that disruptions frequently originated from a specific supplier, decision can be made to switch to another supplier. Further, the experience repository can be used find recurring solutions, which has the potential to standardize and increase efficiency of these solutions. For example, if a supplier often helped to fill supply shortages successfully, then that supplier can be a candidate to sign a master supply agreement.

Example 27—Example Plan Deviation Map

In any of the examples herein, a plan deviation map can be a graphical representation of the new and previous plan deviation alerts. The plan deviation map can show the relationship, such as a similarity between the new and previous plan deviation alerts stored in the experience repository. The plan deviation map can be implemented by the semantic reasoning engine, and can be virtually represented in a computer-readable storage media. In some embodiments, the plan deviation map can also be displayed on a user interface.

Figure 22:
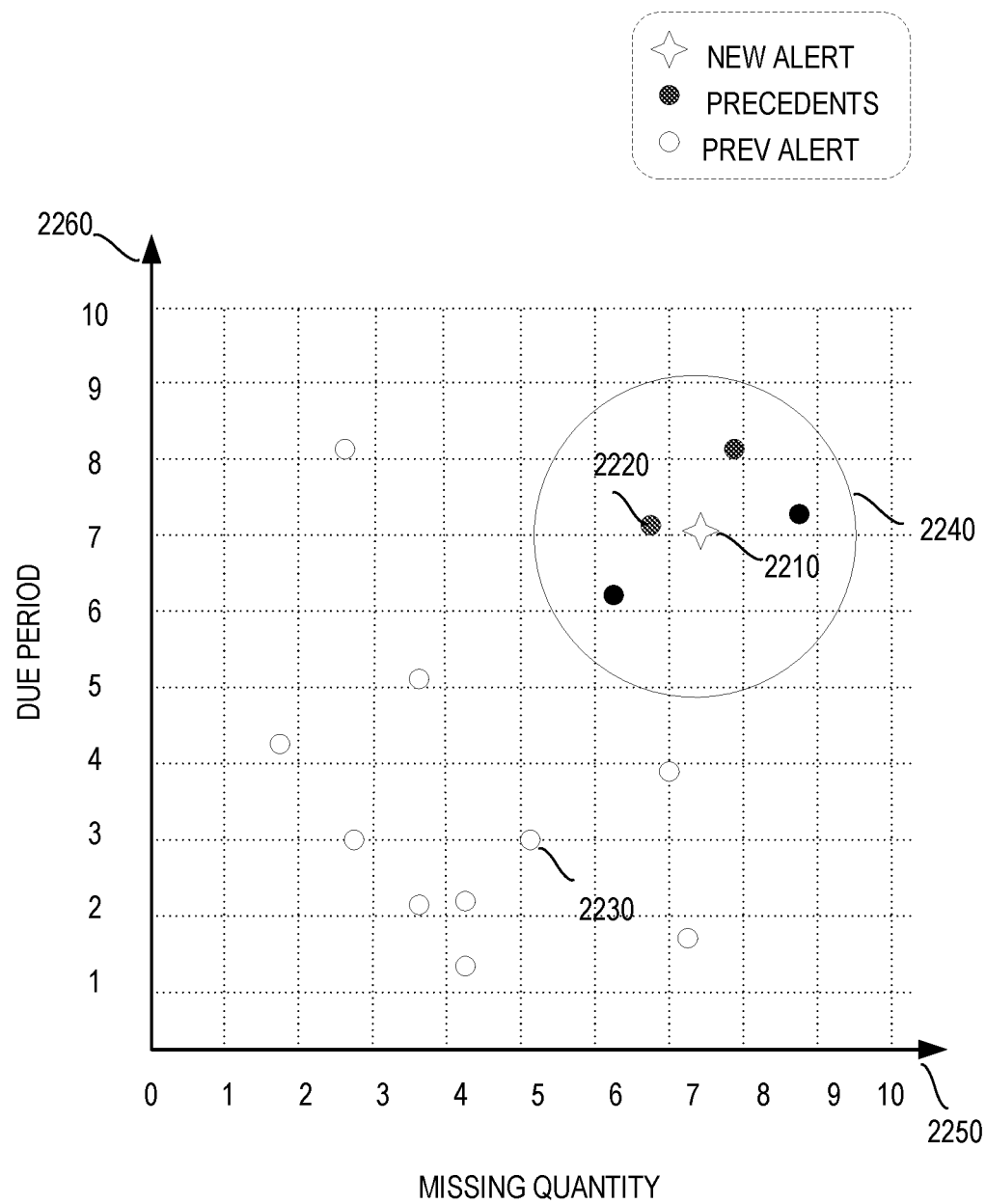
FIG. 22 is an example plan deviation map which can be used to measure similarity between a new plan deviation alert and previous plan deviation alerts.

FIG. 22 is an example plan deviation map 2200 that can be used to measure the similarity between a new plan deviation alert and a previous plan deviation alert, which measurement can be used to identify the precedents of the new plan deviation alert. In this example, a four-point star 2210 represents the new plan deviation alert. Solid circles 2220 represent previous plan deviation alerts that are identified as precedents of the new plan deviation alert 2210. Open circles 2230 represent previous plan deviation alerts that are identified as non-precedents.

In this example, the plan deviation map is two dimensional. A first dimension 2260 can represent a due period for a product and a second dimension 2250 can represent a missing quantity of the product. It should be noted that these two dimensions (due period and quantity of the product) are merely examples. Other dimensions might be used to compare other types of plan deviation alerts. In certain embodiments, both dimensions can be normalized (e.g., the due period can be normalized from 0 to 10 and the missing quantity can be normalized to 0 to 10). Alternatively, the first and second dimensions can be non-normalized. In other embodiments, the plan deviation map 2200 can have more than two dimensions. For example, the plan deviation map can include a third dimension representing a unit cost of the product. In another example, the plan deviation map can include a further dimension representing a quantity scale of the product.

In an example embodiment, cluster analysis can be used to determine similarity between the alerts. For example, the previous plan deviation alert can be determined to be similar to the new plan deviation alert when the distance between the previous plan deviation alert and the new plan deviation alert is smaller than a predefined distance limit. The distance can be measured using any of the distance metrics such as the Euclidean distance, the Manhattan distance, etc.

In this example, the circle 2240, which is centered on the new plan deviation alert 2210 with a predefined radius, can represent the predefined distance limit. Accordingly, any previous plan deviation alerts residing inside the circle 2240, such as 2220, can be identified as precedents of the new plan deviation alert 2210, whereas other previous plan deviation alerts (e.g., 2230) outside the circle 2240 are identified as non-precedents.

Figure 23:
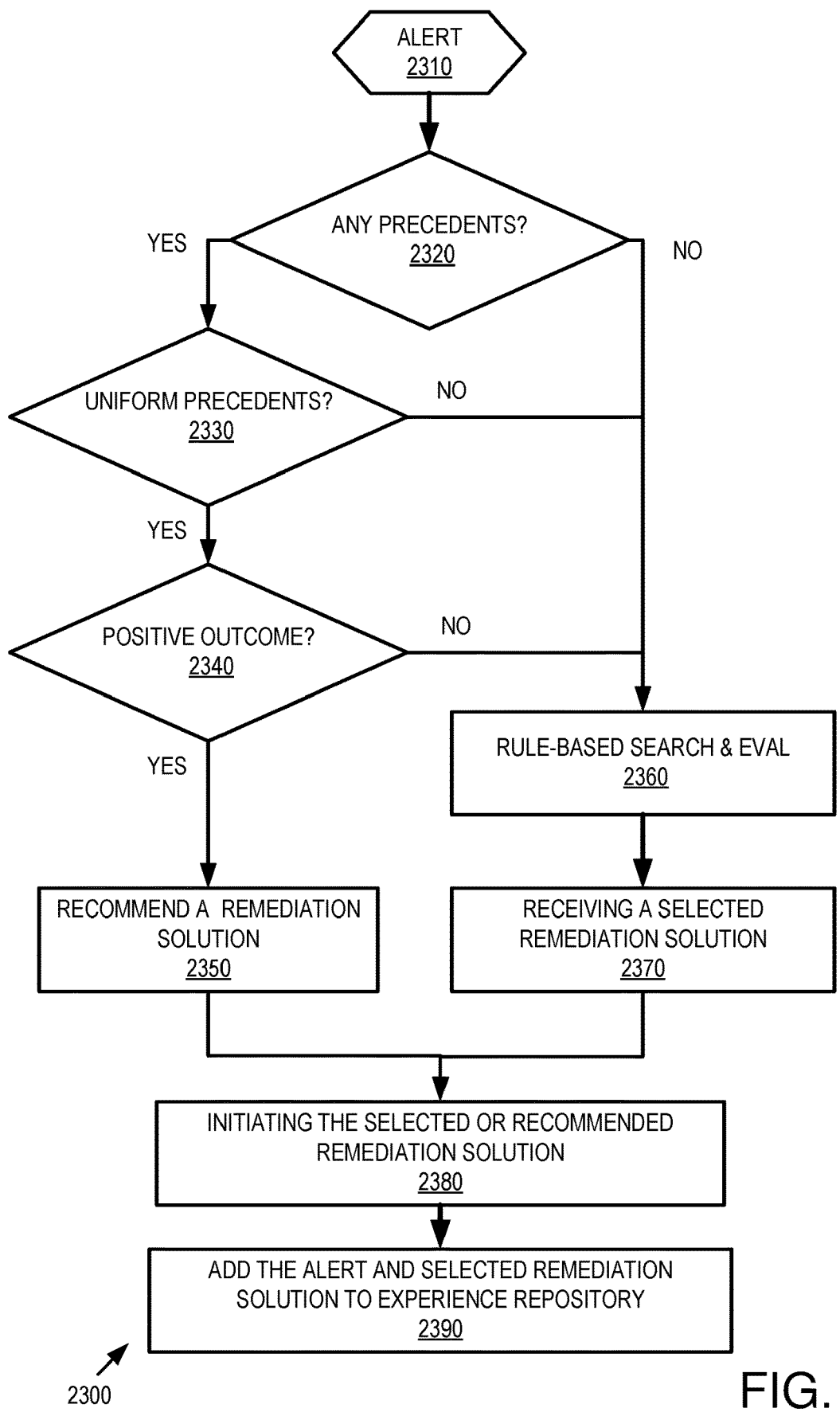
FIG. 23 is a flowchart including example steps for implementing a rule-based decision support system with adaptive learning.

Example 28—Example Method of Implementing Rule-Based Decision Support System with Adaptive Learning FIG. 23 is a flowchart showing example steps of a method 2300 that implements the rule-based decision support system with adaptive learning.

In this example, a new plan deviation alert is received at 2310. The new plan deviation alert can include a deviation level that quantifies a mismatch between the expected supply chain parameters of a product specified by the supply chain plan and the observed supply chain parameters of the product.

At 2320, the method 2300 can check to identify if any precedents of the new plan deviation alert exist in the experience repository.

If no precedents are found, the method 2300 can continue to perform rule-based search and evaluation 2360, which corresponds to 460 in FIG. 4 that represents a combination of steps including searching for potential remediation solutions, evaluating the potential remediation solutions to generate a ranked list of candidate remediation solutions, and display the ranked list of candidate remediation solutions in a user interface. Then at 2370, through the user interface, the method 2300 can receive a selected remediation solution.

On the other hand, if precedents are found, then at 2330, the method 2300 can evaluate whether the selected remediation solutions corresponding to the precedents have a certain degree of uniformity. The degree of uniformity measures how consistent a particular remediation solution has been selected for the precedents. For example, assuming the new plan deviation alert has a total of Z precedents, and the selected remediation solutions are the same for Y out of Z precedents (Y≤Z), then the degree of uniformity among the precedents can be deemed to be Y/Z.

If those selected remediation solutions corresponding to the precedents are deemed not uniform (e.g., Y/Z is smaller than a predefined threshold $P_1$), then steps 2360 and 2370 can be performed. On the other hand, if the selected remediation solutions corresponding to the precedents are deemed to be uniform (e.g., Y/Z is greater than the predefined threshold $P_1$), then the method 2300 can proceed to 2340.

At 2340, the outcomes of the initiated remediation solutions corresponding to the precedents are evaluated. For example, for each of the Y precedents having the uniformly selected remediation solution, its outcome indicating whether or not the initiated remediation solution actually corrected the mismatch can be evaluated. If for X out of Y such precedents (X≤Y, and X/Y is less than a predefined threshold $P_2$), the outcomes are negative (e.g., the initiated remediation solution failed to correct the mismatch, or the cost of correcting the mismatch exceeds a budget limit, etc.), then steps 2360 and 2370 can be performed.

Otherwise, if for X out of Y such precedents (X≤Y, and X/Y is greater than the predefined threshold $P_2$), the outcomes are positive (e.g., the initiated remediation solution successfully corrected the mismatch), the method 2300 can recommend the uniformly selected remediation solution (which is associated with a positive outcome) at 2350.

At 2380, the method 2300 can initiate the selected remediation solution or the recommended remediation solution.

At 2390, the new plan deviation alert and the corresponding selected remediation solution can be added to the experience repository. Optionally, other information, such as the new plan deviation alert, the ranked list of candidate remediation solutions, the actual outcome of the initiated remediation solution, etc., can also be stored in the experience repository.

In alternative embodiments, if step 2330 finds that the selected remediation solutions corresponding to the precedents are not uniform or 2340 finds that the outcomes of the initiated remediation solutions corresponding to the precedents are negative, the method can still proceed to step 2360. However, instead of performing an exhaustive search of all potential remediation solutions (like 460 in FIG. 4), the method can narrow the search space for the potential remediation solutions.

For example, the potential remediation solutions can be limited to those candidate remediation solutions corresponding to the precedents. Because for each precedent, its corresponding candidate remediation solutions were already ranked higher than other non-candidate remediation solutions, limiting the search space to candidate remediation solutions of the precedents can significantly reduce the work load for the rule-based search engine and improve the efficiency of the system.

Example 29—Example Advantages

A number of advantages can be achieved via the technology described herein because they can improve the overall efficiency and efficacy of a SCMS.

For example, in response to a plan deviation alert, the rule-based decision support system described herein can automatically search for potential remediation solutions, evaluate their expended resources, and suggest candidate solutions to a supply chain planner or decision maker. The searching of the potential remediation solutions can be comprehensive, which would not be possible based on existing technology, especially under the time pressure.

The rule-based decision support system described herein can further include an expert system comprising an experience repository and a semantic reasoning engine. Using the feedback provided by the experience repository, the semantic reasoning engine can identify precedents of the new plan deviation alert, quickly narrow down the solution space and automatically recommend a remediation solution that has been proved to be successful in the past to resolve the current plan deviation. In addition, such feedback can inform planner about precedents and outcomes, thus increasing their confidence and acceptance of the new system. Based on such feedback, the supply chain planners can learn how their peers solved similar problems, thus supporting experience sharing and improving collective expertise.

Further, instead of relying on a large amount of training data like some other expert systems, the rule-based decision support system described herein can build the experience repository from scratch based on its own learning experience. Such self-learning feature is particularly advantageous because the resulting expert system is tailored to the specific SCMS and more adaptive to the changing environment of the SCMS.

Example 30—Example Computing Systems

Figure 24:
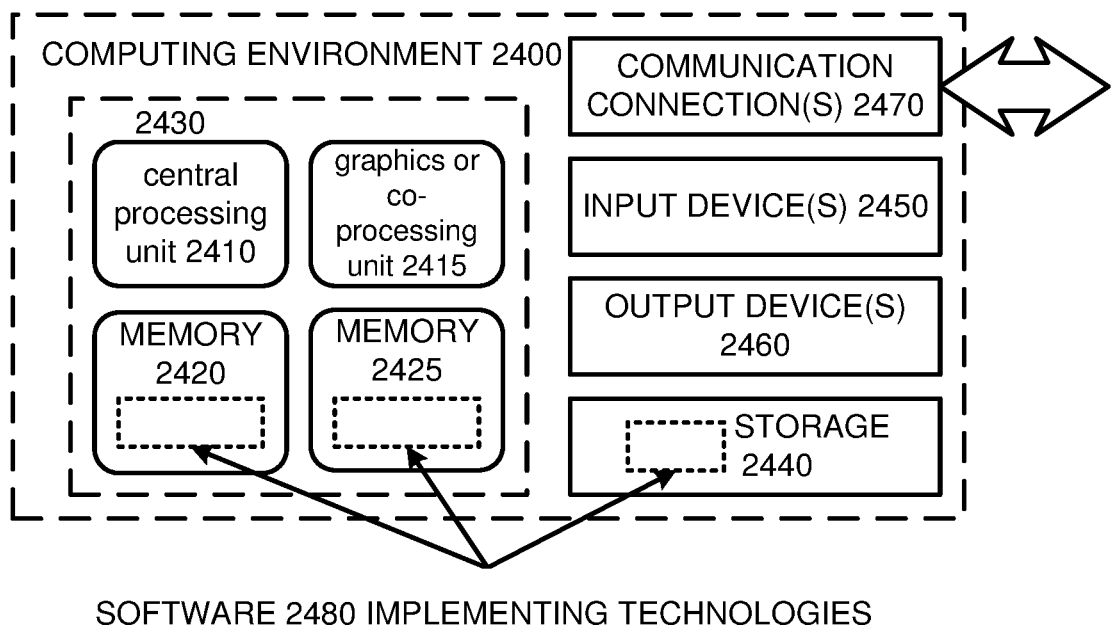
FIG. 24 is a block diagram of an example computing system in which described embodiments can be implemented.

FIG. 24 depicts an example of a suitable computing system 2400 in which the described innovations can be implemented. The computing system 2400 is not intended to suggest any limitation as to scope of use or functionality of the present disclosure, as the innovations can be implemented in diverse computing systems.

With reference to FIG. 24, the computing system 2400 includes one or more processing units 2410, 2415 and memory 2420, 2425. In FIG. 24, this basic configuration 2430 is included within a dashed line. The processing units 2410, 2415 execute computer-executable instructions, such as for implementing the features described in the examples herein. A processing unit can be a general-purpose central processing unit (CPU), processor in an application-specific integrated circuit (ASIC), or any other type of processor. In a multi-processing system, multiple processing units execute computer-executable instructions to increase processing power. For example, FIG. 24 shows a central processing unit 2410 as well as a graphics processing unit or co-processing unit 2415. The tangible memory 2420, 2425 can be volatile memory (e.g., registers, cache, RAM), non-volatile memory (e.g., ROM, EEPROM, flash memory, etc.), or some combination of the two, accessible by the processing unit(s) 2410, 2415. The memory 2420, 2425 stores software 2480 implementing one or more innovations described herein, in the form of computer-executable instructions suitable for execution by the processing unit(s) 2400, 2415.

A computing system 2400 can have additional features. For example, the computing system 2400 includes storage 2440, one or more input devices 2450, one or more output devices 2460, and one or more communication connections 2470, including input devices, output devices, and communication connections for interacting with a user. An interconnection mechanism (not shown) such as a bus, controller, or network interconnects the components of the computing system 2400. Typically, operating system software (not shown) provides an operating environment for other software executing in the computing system 2400, and coordinates activities of the components of the computing system 2400.

The tangible storage 2440 can be removable or non-removable, and includes magnetic disks, magnetic tapes or cassettes, CD-ROMs, DVDs, or any other medium which can be used to store information in a non-transitory way and which can be accessed within the computing system 2400. The storage 2440 stores instructions for the software 2480 implementing one or more innovations described herein.

The input device(s) 2450 can be an input device such as a keyboard, mouse, pen, or trackball, a voice input device, a scanning device, touch device (e.g., touchpad, display, or the like) or another device that provides input to the computing system 2400. The output device(s) 2460 can be a display, printer, speaker, CD-writer, or another device that provides output from the computing system 2400.

The communication connection(s) 2470 enable communication over a communication medium to another computing entity. The communication medium conveys information such as computer-executable instructions, audio or video input or output, or other data in a modulated data signal. A modulated data signal is a signal that has one or more of its characteristics set or changed in such a manner as to encode information in the signal. By way of example, and not limitation, communication media can use an electrical, optical, RF, or other carrier.

The innovations can be described in the context of computer-executable instructions, such as those included in program modules, being executed in a computing system on a target real or virtual processor (e.g., which is ultimately executed on one or more hardware processors). Generally, program modules or components include routines, programs, libraries, objects, classes, components, data structures, etc. that perform particular tasks or implement particular abstract data types. The functionality of the program modules can be combined or split between program modules as desired in various embodiments. Computer-executable instructions for program modules can be executed within a local or distributed computing system.

For the sake of presentation, the detailed description uses terms like "determine" and "use" to describe computer operations in a computing system. These terms are high-level descriptions for operations performed by a computer, and should not be confused with acts performed by a human being. The actual computer operations corresponding to these terms vary depending on implementation.

Example 31—Computer-Readable Media

Any of the computer-readable media herein can be non-transitory (e.g., volatile memory such as DRAM or SRAM, nonvolatile memory such as magnetic storage, optical storage, or the like) and/or tangible. Any of the storing actions described herein can be implemented by storing in one or more computer-readable media (e.g., computer-readable storage media or other tangible media). Any of the things (e.g., data created and used during implementation) described as stored can be stored in one or more computer-readable media (e.g., computer-readable storage media or other tangible media). Computer-readable media can be limited to implementations not consisting of a signal.

Any of the methods described herein can be implemented by computer-executable instructions in (e.g., stored on, encoded on, or the like) one or more computer-readable media (e.g., computer-readable storage media or other tangible media) or one or more computer-readable storage devices (e.g., memory, magnetic storage, optical storage, or the like). Such instructions can cause a computing device to perform the method. The technologies described herein can be implemented in a variety of programming languages.

Example 32—Example Cloud Computing Environment

Figure 25:
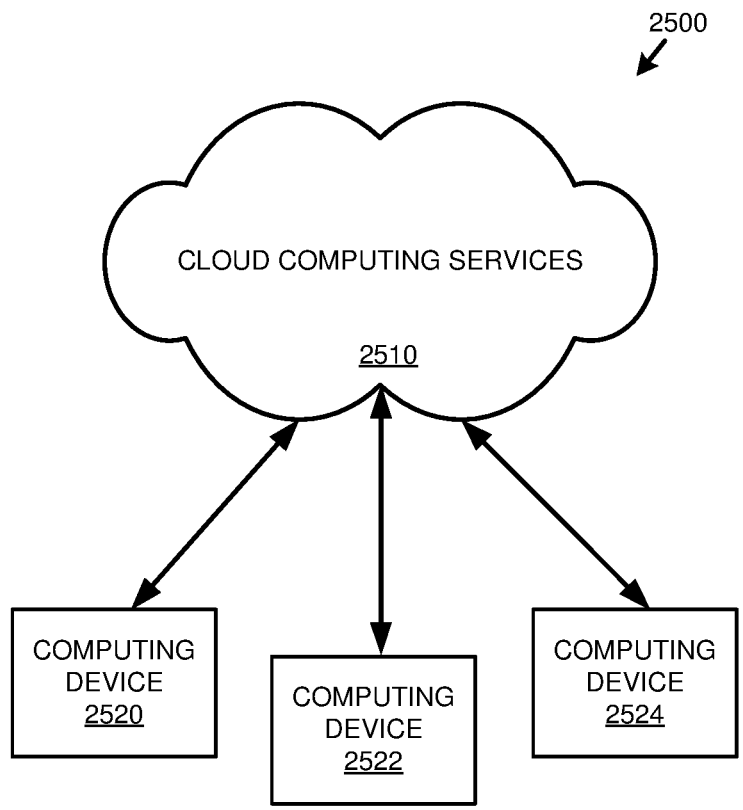
FIG. 25 is a block diagram of an example cloud computing environment that can be used in conjunction with the technologies described herein.

FIG. 25 depicts an example cloud computing environment 2500 in which the described technologies can be implemented, including, e.g., the system 100 of FIG. 1, system 200 of FIG. 2, and other systems herein. The cloud computing environment 2500 comprises cloud computing services 2510. The cloud computing services 2510 can comprise various types of cloud computing resources, such as computer servers, data storage repositories, networking resources, etc. The cloud computing services 2510 can be centrally located (e.g., provided by a data center of a business or organization) or distributed (e.g., provided by various computing resources located at different locations, such as different data centers and/or located in different cities or countries).

The cloud computing services 2510 are utilized by various types of computing devices (e.g., client computing devices), such as computing devices 2520, 2522, and 2524. For example, the computing devices (e.g., 2520, 2522, and 2524) can be computers (e.g., desktop or laptop computers), mobile devices (e.g., tablet computers or smart phones), or other types of computing devices. For example, the computing devices (e.g., 2520, 2522, and 2524) can utilize the cloud computing services 2510 to perform computing operations (e.g., data processing, data storage, and the like).

In practice, cloud-based, on-premises-based, or hybrid scenarios can be supported.

Example 33—Example Implementations

Although the operations of some of the disclosed methods are described in a particular, sequential order for convenient presentation, such manner of description encompasses rearrangement, unless a particular ordering is required by specific language set forth herein. For example, operations described sequentially can in some cases be rearranged or performed concurrently.

Example 34—Example Alternatives

The technologies from any example can be combined with the technologies described in any one or more of the other examples. In view of the many possible embodiments to which the principles of the disclosed technology can be applied, it should be recognized that the illustrated embodiments are examples of the disclosed technology and should not be taken as a limitation on the scope of the disclosed technology. Rather, the scope of the disclosed technology includes what is covered by the scope and spirit of the following claims.

What is claimed is:

1. A computer-implemented method comprising:
   receiving a new plan deviation alert comprising a deviation level, wherein the deviation level quantifies a mismatch between expected supply chain parameters specified by a SCMS plan and observed SCMS parameters;
   testing a plurality of remediation solutions for correcting the mismatch, wherein the testing comprises navigating successful paths within SCMS declarative rules from general solutions to specific predicates that are tested against stored SCMS resources and constraints, wherein the SCMS declarative rules are implemented by a declarative logic programming language and comprise predicate expressions that use logical operators to describe a relationship between SCMS resources and constraints, wherein the testing performs a rule-based search for which of the plurality of remediation solutions are possible and enumerates the plurality of remediation solutions that are possible, given the SCMS resources and constraints, wherein the rule-based search comprises querying the SCMS declarative rules based on at least the SCMS resources and constraints, wherein the querying returns a list of activities that lead to the plurality of possible remediation solutions, wherein the activities, if executed, modify the SCMS resources within the constraints;
   transforming the successful paths within the SCMS declarative rules into activity-based views, wherein the activity-based views comprise the list of activities;
   evaluating expended resource simulations associated with the plurality of possible remediation solutions, wherein evaluating expended resources comprises simulating implementation of activities within the activity-based views of the plurality of possible remediation solutions;
   based on the evaluated expended resource simulations, generating, out of the possible remediation solutions, a ranked list of candidate remediation solutions;
   displaying, in a user interface, the ranked list of candidate remediation solutions; and
   executing a remediation solution selected from the ranked list of the candidate remediation solutions;
   wherein performing the rule-based search comprises determining a deviation remediation goal based on the deviation level, and wherein the possible remediation solutions meet the deviation remediation goal,
   wherein determining the deviation remediation goal comprises recursively dividing the deviation remediation goal into sub-goals corresponding to sub-rules that are invocable by at least one of the predicates,
   wherein the querying comprises recursively finding activities that meet the sub-goals,
   wherein the transforming comprises recursively appending found activities that meet the sub-goals to the activity-based views.

2. The computer-implemented method of claim 1, wherein performing the rule-based search comprises automatically instantiating the SCMS declarative rules based on the deviation remediation goal and the SCMS resources and constraints; wherein instantiating an SCMS declarative rule comprises generating a tree diagram comprising a root node representing a rule name and a plurality of leaves representing predicates of the SCMS declarative rule.

3. The computer-implemented method of claim 2, wherein performing the rule-based search further comprises defining at least some of the SCMS declarative rules via the user-interface.

4. The computer-implemented method of claim 2, wherein performing the rule-based search further comprises constructing a recursive backward chain based on the deviation remediation goal, the SCMS declarative rules, and the SCMS resources and constraints.

5. The computer-implemented method of claim 1 further comprising:
receiving, via the user interface, a selected remediation solution from the ranked list of candidate remediation solutions; and
adding the new plan deviation alert and the selected remediation solution corresponding to the new plan deviation alert to an experience repository.

6. The computer-implemented method of claim 5 further comprising identifying precedents of the new plan deviation alert in the experience repository, wherein a precedent represents a previous plan deviation alert stored in the experience repository that is determined to be similar to the new plan deviation alert, based on measuring a distance between the new plan deviation alert and the previous plan deviation alert on a plan deviation map.

7. The computer-implemented method of claim 6, wherein the deviation level comprises a due period and a quantity of a product, and wherein the plan deviation map comprises a first dimension representing a normalized due period and a second dimension representing a normalized quantity of the product.

8. The computer-implemented method of claim 6, wherein the previous plan deviation alert stored in the experience repository is determined to be similar to the new plan deviation alert when the distance between the previous plan deviation alert and the new plan deviation alert is smaller than a predefined distance limit.

9. The computer-implemented method of claim 6 further comprising:
evaluating a degree of uniformity of the selected remediation solutions corresponding to the precedents; and
recommending, via the user interface, a uniform remediation solution when the degree of uniformity of the selected remediation solutions corresponding to the precedents exceeds a predefined threshold.

10. The computer-implemented method of claim 6 further comprising adding an outcome of the selected remediation solution to the experience repository, the outcome indicating whether the selected remediation solution actually corrects the mismatch.

11. The computer-implemented method of claim 10 further comprising:
evaluating a degree of uniformity of the selected remediation solutions corresponding to the precedents and the outcome of the selected remediation solutions corresponding to the precedents; and
recommending, via the user interface, a uniform remediation solution when the degree of uniformity of the selected remediation solutions corresponding to the precedents exceeds a predefined threshold and the outcome of the selected remediation solutions corresponding to the precedents indicates the selected remediation solutions actually correct the mismatch.

12. A rule-based decision support system comprising:
one or more processors;
a plan deviation alert manager adapted to receive a new plan deviation alert comprising a deviation level, wherein the deviation level quantifies a mismatch between expected supply chain parameters specified by a supply chain plan and observed supply chain parameters;
a rule-based search engine adapted to perform a rule-based search of data defining supply chain resources and constraints, wherein the rule-based search queries a set of declarative rules to find a plurality of potential remediation solutions to correct the mismatch, wherein the declarative rules are implemented by a declarative logic programming language and comprise predicate expressions that use logical operators to describe a relationship between the supply chain resources and constraints;
a remediation simulator adapted to simulate implementation of the plurality of potential remediation solutions, and based on results of simulation, evaluate expended resources associated with the plurality of potential remediation solutions;
a remediation advisor adapted to generate a ranked list of candidate remediation solutions out of the potential remediation solutions based on the evaluated expended resources; and
a user interface adapted to display the ranked list of candidate remediation solutions and receive a selected remediation solution from the ranked list of candidate remediation solutions,
wherein the plan deviation alert manager is adapted to determine a deviation remediation goal based on the deviation level,
wherein the rule-based search engine is configured to generate activity-based views comprising a list of activities that lead to the plurality of potential remediation solutions, wherein the list of activities are returned by the rule-based search, and the activities, if executed, modify the supply chain resources within the constraints,
wherein the rule-based search engine is configured to recursively divide the deviation remediation goal into sub-goals corresponding to sub-rules that are invocable by at least one of the predicates, recursively find activities that meet the sub-goals, and recursively append found activities that meet the sub-goals to the activity-based views.

13. The rule-based decision support system of claim 12, wherein the rule-based search engine is adapted to automatically instantiate the set of declarative rules based on the deviation remediation goal and the supply chain resources and constraints.

14. The rule-based decision support system of claim 13, wherein the rule-based search engine is adapted to construct a recursive backward chain based on the deviation remediation goal, the set of declarative rules, and the supply chain resources and constraints.

15. The rule-based decision support system of claim 12 further comprising an experience repository, wherein the new plan deviation alert and the selected remediation solution corresponding to the new plan deviation alert are added to the experience repository.

16. The rule-based decision support system of claim 15 further comprising a semantic reasoning engine adapted to, by the one or more processors, identify precedents of the new plan deviation alert in the experience repository, wherein a precedent represents a previous plan deviation alert stored in the experience repository that is determined to be similar to the new plan deviation alert.

17. The rule-based decision support system of claim 16, wherein the previous plan deviation alert stored in the experience repository is determined to be similar to the new plan deviation alert when a distance between the previous plan deviation alert and the new plan deviation alert is smaller than a predefined distance limit, wherein the distance is measured on a plan deviation map having a first dimension representing a normalized due period and a second dimension representing a normalized quantity of a product.

18. The rule-based decision support system of claim 16 wherein the remediation advisor is further adapted to evaluate a degree of uniformity of the selected remediation solutions corresponding to the precedents, and recommend a uniform remediation solution when the degree of uniformity of the selected remediation solutions corresponding to the precedents exceeds a predefined threshold.

19. One or more non-transitory computer-readable media comprising computer-executable instructions that, when executed, cause a computing system to perform a method, the method comprising:

receiving a new plan deviation alert comprising a deviation level, wherein the deviation level quantifies a mismatch between expected supply chain parameters of a product specified by a supply chain plan and observed supply chain parameters of the product;

responsive to the new plan deviation alert, performing a rule-based search of data defining supply chain resources and constraints to find a plurality of potential remediation solutions to correct the mismatch, wherein performing the rule-based search comprises determining a deviation remediation goal based on the deviation level, querying a set of declarative rules based on the deviation remediation goal and the supply chain resources and constraints, and constructing a recursive backward chain based on the deviation remediation goal, the set of declarative rules, and the supply chain resources and constraints, wherein the declarative rules are implemented by a declarative logic programming language and comprise predicate expressions that use logical operators to describe a relationship between the supply chain resources and constraints, wherein the querying returns a list of activities that lead to the plurality of potential remediation solutions, wherein the activities, if executed, modify the supply chain resources within the constraints;

generating activity-based views that comprise the list of activities;

evaluating expended resources associated with the plurality of potential remediation solutions, wherein evaluating expended resources comprises simulating implementation of the plurality of potential remediation solutions;

out of the potential remediation solutions, generating a ranked list of candidate remediation solutions based on the evaluated expended resources;

displaying, in a user interface, the ranked list of candidate remediation solutions;

receiving, via the user interface, a selected remediation solution from the ranked list of candidate remediation solutions;

adding the new plan deviation alert and the selected remediation solution corresponding to the new plan deviation alert to an experience repository;

adding an outcome of the selected remediation solution to the experience repository, the outcome indicating whether the selected remediation solution actually corrects the mismatch;

identifying precedents of the new plan deviation alert in the experience repository, wherein a precedent represents a previous plan deviation alert for the product stored in the experience repository that is determined to be similar to the new plan deviation alert, based on a measurement of distance between the previous plan deviation alert and the new plan deviation alert on a plan deviation map having a first dimension representing a normalized due period and a second dimension representing a normalized quantity of the product;

evaluating a degree of uniformity of the selected remediation solutions corresponding to the precedents and the outcome of the selected remediation solutions corresponding to the precedents; and recommending a uniform remediation solution when the degree of uniformity of the selected remediation solutions corresponding to the precedents exceeds a predefined threshold and the outcome of the selected remediation solutions corresponding to the precedents indicates the selected remediation solutions actually correct the mismatch, wherein determining the deviation remediation goal comprises recursively dividing the deviation remediation goal into sub-goals corresponding to sub-rules that are invocable by at least one of the predicates, wherein the querying comprises recursively finding activities that meet the sub-goals, wherein generating activity-based views comprises recursively appending found activities that meet the sub-goals to the activity-based views.

* * * * *